United States Patent
Izumi et al.

(10) Patent No.: US 7,388,184 B2
(45) Date of Patent: Jun. 17, 2008

(54) IMAGE READING DEVICE AND IMAGE READING METHOD

(75) Inventors: Yoshihiro Izumi, Kashihara (JP); Kazuhiro Uehara, Tenri (JP); Tomohiko Oda, Tenri (JP); Osamu Teranuma, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 484 days.

(21) Appl. No.: 10/531,277

(22) PCT Filed: Sep. 16, 2003

(86) PCT No.: PCT/JP03/11794

§ 371 (c)(1),
(2), (4) Date: Apr. 13, 2005

(87) PCT Pub. No.: WO2004/039059

PCT Pub. Date: May 6, 2004

(65) Prior Publication Data

US 2005/0270590 A1    Dec. 8, 2005

(30) Foreign Application Priority Data

Oct. 24, 2002    (JP)    ............................ 2002-309967

(51) Int. Cl.
    *H04N 1/028*    (2006.01)
(52) U.S. Cl. .................................... 250/208.1; 358/482
(58) Field of Classification Search .............. 250/208.1; 348/308; 358/482
    See application file for complete search history.

(56) References Cited

U.S. PATENT DOCUMENTS

| 5,920,401 | A  | * | 7/1999 | Street et al. ............... 358/400 |
| 6,859,231 | B1 | * | 2/2005 | Sumi et al. ................ 348/302 |
| 2002/0093581 | A1 |  | 7/2002 | Ikeda et al. |
| 2004/0135911 | A1 | * | 7/2004 | Nathan et al. ............. 348/308 |

FOREIGN PATENT DOCUMENTS

| JP | 58-18978 | 2/1983 |
| JP | 2-8055 | 1/1990 |
| JP | 5-30278 | 2/1993 |
| JP | 5-243547 | 9/1993 |
| JP | 6-347753 | 12/1994 |
| JP | 10-90655 | 4/1998 |
| WO | 94/25954 | 11/1994 |

OTHER PUBLICATIONS

Japanese Office Action and English translation thereof mailed Sep. 5, 2006 in corresponding Japanese application No. 2002-309967.

* cited by examiner

*Primary Examiner*—John R Lee
(74) *Attorney, Agent, or Firm*—Nixon & Vanderhye P.C.

(57) ABSTRACT

The image reading device of the present invention includes (i) a sensor substrate which functions as a photoelectric transfer element having a photodetecting TFT and a pixel capacitor and (ii) a driving IC for applying a voltage to a gate electrode of the photodetecting TFT so as to drive the photodetecting TFT into an ON state or an OFF state. The driving IC applies a voltage, whose polarity is opposite to average polarity of a voltage making the photodetecting TFT in the OFF state, to the gate electrode of the photodetecting TFT in an arbitrary period. Thus, it is possible to provide the image reading device which can suppress variation of a photodetecting TFT property (resistance value) which is observed in a short time.

14 Claims, 32 Drawing Sheets

TIMING CHART OF SCANNING ※

(STRESS APPLICATION CONDITION)
Vg WAVEFORM: DUTY RATIO OF COMPENSATION SIGNAL
              APPLICATION TIME IS FIXED TO 1/10
NO LIGHT EMISSION
STRESS TIME 15min (Iphoto MEASUREMENT CONDITION)
Vg=-10V
Vsd=1V
LIGHT EMISSION 1000lx

US 7,388,184 B2

IMAGE READING DEVICE AND IMAGE READING METHOD

This application is the US national phase of international application PCT/JP2003/011794 filed 16 Sep. 2003 which designated the U.S. and claims priority of JP 2002-309967, filed 24 Oct. 2002, the entire contents of each of which are hereby incorporated by reference.

TECHNICAL FIELD

The present invention relates to an image reading device and an image reading method in which a thin film transistor having a photo response property is used as a photodetecting element.

BACKGROUND ART

There has been widely used a flat bed scanner, which can read a two-dimensional image by causing a linear sensor (CCD linear sensor and the like) whose pixels are disposed in a line manner (X direction) to perform line scanning (Y direction), as a contact-type image reading device for reading a document or a photograph.

However, since a scanner having such linear sensor includes a mechanical scanning system for reading the two-dimensional image, there is limit in making the scanner thinner and lighter, so that there arises such a problem that it is difficult to improve a reading speed.

Then, there is developed an active-matrix-type two-dimensional image sensor (image reading device), in which photodetecting elements (photodiode, phototransistor, and the like) and switching elements (thin film transistor and the like) are disposed in a two-dimensional manner, so as to make the image reading device thinner and lighter and to improve the reading speed.

According to the method, it is possible to read the two-dimensional image without using the mechanical scanning system, so that it is possible to realize not more than 1/10 thickness, weight, and the reading time, compared with "flat bed scanner" using a conventional CCD line sensor, thereby realizing an image reading device which can be conveniently used.

An example of the active-matrix-type image reading device is an active-matrix-type image reading device disclosed in Patent Document 1: Japanese Utility Model Publication No. 8055/1990 (Jitsukaihei 2-8055)(Publication date: Jan. 18, 1990) and Patent Document 2: Japanese Unexamined Patent Publication No. 243547/1993 (Tokukaihei 5-243547) (Publication date: Sep. 21, 1993).

An active matrix array (active matrix substrate) used in the active-matrix-type image reading device includes pixels disposed in an XY matrix manner as shown in FIG. 21, and each pixel has a photodetecting thin film transistor (referred to as photodetecting TFT), a switching thin film transistor (referred to as switching TFT), and a pixel capacitor (storage capacitor).

FIG. 32 shows a property of the photodetecting TFT of the pixel. When light reflected by a surface of a document is incident on the TFT under such condition that a voltage of a gate electrode is set to Vg1 so as to turn OFF the TFT (a condition under which a source-drain electrode functions as a high resistor), a source-drain current increases from a dark current (I dark) to a bright current (I photo). That is, a resistance value of the TFT is made lower.

Note that, a photodetecting principle, in which photo response of the source-drain current of the TFT which is turned OFF is utilized, is disclosed in Patent Document 3: Japanese Unexamined Patent Publication No. 18978/1983 (Tokukaisho 58-18978)(Publication date: Feb. 3, 1983). When the principle is used, a size of I photo varies depending on brightness of a photogenic subject such as a document surface, i.e., a reflection coefficient of light, so that differences occur in an amount of an electric charge stored in the storage capacitor of each pixel (or discharged from the storage capacitor) due to differences in I photo. Electric charge amount distributions (in-plane distributions) of the storage capacitor are sequentially read by using the switching TFT of the active matrix substrate, so that it is possible to obtain the two-dimensional information of the photogenic subject.

Generally, in the TFT, a-Si (amorphous silicon) or poly-Si (polycrystalline silicon) are used as a semiconductor material, and SiN or $SiO_2$ obtained by performing a plasma CVD film formation is used as a material for a gate insulating film. It is known that: the TFT is driven for an extended period of time in such a state that a bias stress is applied to the gate electrode, so that carrier is injected into the gate insulating film or an interface between the gate insulating film and a semiconductor film, thereby shifting Vth (threshold value voltage). Then, it is pointed out that: the shift of Vth has influence on a lifetime of a display device or an X ray imaging device using such TFT.

For example, in case of using the TFT as a switching element (address element) of the display device, when Vth of the TFT shifts while being used for an extended period of time, there arises such a problem that a display performance is deteriorated. Thus, for example, Patent Document 4: Japanese Unexamined Patent Publication No. 347753/1994 (Tokukaihei 6-347753)(Publication date: Dec. 22, 1994) discloses such method that: a voltage, whose polarity is opposite to a bias applied to the gate electrode while the display device is in an ON state, is applied to the gate electrode while the display device is in an OFF state so as to restore the shift of Vth of the TFT.

While, in case of using the TFT as a switching element (address element) of the X ray imaging device, the shift of Vth of the TFT makes a dynamic range of a detection signal smaller, so that there arises such a problem that detection of a feeble signal is unstable. Thus, for example, Patent Document 5: Japanese unexamined Patent Publication No. 151669/2002 (Tokukai 2002-151669, Publication date: May 24, 2002) (Corresponding U.S. application No. US2002/0093581A1, Publication date: Jul. 18, 2002) discloses such method that: a voltage, whose polarity is opposite to a bias applied to the gate electrode while the device is operating, is applied to the gate electrode while the device is not operating so as to prevent Vth of the TFT from shifting.

Such shifting phenomenon of Vth of the TFT is regarded as a troublesome problem caused in the case where the TFT is used as the switching element of the display device or the X ray imaging device and the device is used for an extended period of time. Further, in order to solve the problem, trial to restore or prevent the Vth shifting within the lifetime has been performed in view of using the device for an extended period of time.

Incidentally, the present inventors found that a similar problem occurs not only in the case of using the TFT as the switching element (address element) as described above but also a case of using the TFT as a photodetecting element (photodetecting TFT).

Concretely, when Vg1 (i.e., negative bias) was applied to a photodetecting gate electrode, such variation that a value of I dark or I photo gradually increases, that is, such variation that a resistance value of the TFT gradually drops was found.

Moreover, not the Vth shifting in a long range that has been the troublesome problem, but variation of the resistance value that occurs in an extremely short time was observed. When a single TFT is measured by using a probe, it was found that: as shown in FIG. 33, the variation of the resistance value began right after a gate voltage of Vg1 (here, −10V) had been applied, and the resistance value dropped so as not to exceed 20% in 15 minutes.

In the case of the conventional TFT used as the switching element of the display device or the X ray imaging device, the TFT is used merely as a switch for performing line-sequential address, so that there is no problem in using the TFT as long as the resistance value of the TFT is not less than a certain reference (or not more than the reference). Thus, the variation of the resistance value of the TFT which occurs in a short time such as 15 minutes has not been regarded as a problem conventionally.

However, in a case of an image reading device using the TFT as the photodetecting element, the resistance value shifting of the TFT occurs as variation of the detection signal. Thus, there arises the following problem.

Generally, in the image reading device, a calibration operation is performed before using the device (for example, right after a power source is turned ON), and sensitivity of the photodetecting TFT element and correction data of a gray scale property are obtained. Further, in the next step, actual image reading is performed, and image correction is performed on the basis of the aforementioned correction data.

However, when the resistance value of the TFT varies in a short time as described above, there arises such a problem that it is impossible to perform proper image correction on the basis of the correction data obtained in the first calibration operation. In order to solve the problem, calibration may be performed frequently (for example, every time an image is obtained), but this method is not preferable since the operability of the image reading device is largely lowered.

Further, when influences exerted by the short-time variations of the TFT are accumulated, this causes such large variation that it is possible to restore the data, so that long-time reliability may be lost.

Thus, the following fact was found: in the case of using the TFT as the photodetecting element (photodetecting TFT), it is required to suppress the variation of the resistance value of the TFT, that is observed in a short-time (approximately 15 minutes) sequential operation, so as not to exceed 10%, so that any solution for this problem is required.

The present invention was conceived in view of the foregoing problems, and its object is to provide an image reading device and an image reading method by which it is possible to inhibit the photodetecting TFT property (resistance value) observed in a short time.

DISCLOSURE OF INVENTION

The image reading device of the present invention, which uses a thin film transistor having a photo response property as a photodetecting element, includes a driving circuit for applying a voltage to a gate electrode of the thin film transistor so as to drive the thin film transistor into an ON state or an OFF state, wherein the driving circuit applies a voltage, whose polarity is opposite to average polarity of a voltage making the thin film transistor in the OFF state, to the gate electrode in an arbitrary period.

According to the arrangement, by applying a voltage, whose polarity is opposite to average polarity of the voltage making the thin film transistor in the OFF state, to the gate electrode in the arbitrary period, it is possible to prevent disadvantage which occurs in case of keeping on applying the voltage, making the thin film transistor in the OFF state, to the gate electrode, that is, it is possible to suppress the short-time variation of a resistance value of the thin film transistor.

In this manner, by suppressing the short-time variation of the resistance value of the thin film transistor used as a photodetecting element, it is possible to appropriately correct (i) sensitivity of the thin film transistor and (ii) correction data that has been obtained in a calibration operation performed to obtain the correction data with respect to a gray scale property.

As the correction data at this time, it is possible to use first calibration data that has been obtained in a calibration operation performed right after turning ON a power source of the device, so that it is not necessary to frequently perform the calibration operation unlike conventional techniques.

Further, influences of the short-time variation of the resistance value of the thin film transistor are not accumulated, so that there is no possibility that the variation is so large that it is difficult to restore the variation. Thus, it is possible to obtain the reliability kept for an extended period of time.

Therefore, it is possible to perform image reading stably for an extended period of time. As a result, it is possible to obtain such advantage that the operability and the reliability of the image reading device are improved.

It is preferable that the arbitrary period is a period in which the image reading is not performed so as not to influence the image reading.

Generally, when the thin film transistor is used as a photodetecting element, it is necessary to suppress the short-time variation of the resistance value of the thin film transistor so as not to exceed 10% in consideration for the light detection accuracy.

Then, in order to suppress the short-time variation of the resistance value of the thin film transistor so as not to exceed 10%, the following procedure is performed.

A time for applying a voltage in the arbitrary period is set so that a rate indicating relative variation of a bright current of the thin film transistor is within a range from 0.9 to 1.1.

Further, the arbitrary period is set to be a period whose length is 3% to 30% with respect to an entire period in which the thin film transistor is driven.

Further, when images are sequentially read at an arbitrary cycle, the cycle is set to 0.1 Hz to 10 Hz.

Further, the photodetecting element may function as a pixel selection element for selecting a pixel.

In this case, it is possible to realize an image reading device, having a simple structure, which realizes highly-fine image reading, and it is also possible to improve the operability and the reliability of the device.

Further, a potential of a voltage applied to the gate electrode in the arbitrary period may be set to be equal to a potential of a voltage in the case where the thin film transistor is in the ON state.

In this case, a potential of the voltage applied to the gate electrode in the arbitrary period may be set to be equal to a potential of a voltage making the thin film transistor in the ON state, so that the voltage applied to the gate electrode can be used as both (i) the voltage making the thin film transistor in the ON state and (ii) a voltage which functions as the compensation signal.

Thus, it is not necessary to switch the voltage in a complicate manner, so that it is possible to simplify the structure of the driver for driving the gate electrode. As a result, it is possible to miniaturize the device and to reduce the power consumption.

An image reading method, in which a document image is read by detecting a photoelectric transfer amount of a photoelectric transfer element which has (i) a thin film transistor having a photo response property and (ii) a storage capacitor connected to the thin film transistor, includes: a first step of charging the storage capacitor with a predetermined amount of electric charge; a second step of discharging the electric charge from the storage capacitor, by emitting light to the thin film transistor while the thin film transistor is being in an OFF state, after charging the storage capacitor with the electric charges; a third step of detecting the photoelectric transfer amount of the photoelectric transfer element by obtaining an amount of remaining electric charge in the storage capacitor after discharging the electric charge; and a fourth step, when the three steps are regarded as one cycle of image reading, of applying a voltage, whose polarity is opposite to average polarity of a voltage making the thin film transistor in the OFF state, to a gate electrode of the thin film transistor within a period in which the third step shifts to the first step of a next cycle.

According to the arrangement, by applying a voltage, whose polarity is opposite to average polarity of the voltage making the thin film transistor in the OFF state, to the gate electrode in the arbitrary period, it is possible to prevent disadvantage which occurs in case of keeping on applying the voltage, making the thin film transistor in the OFF state, to the gate electrode, that is, it is possible to suppress the short-time variation of a resistance value of the thin film transistor.

In this manner, by suppressing the short-time variation of the resistance value of the thin film transistor used as a photodetecting element, it is possible to appropriately correct (i) sensitivity of the thin film transistor and (ii) correction data that has been obtained in a calibration operation performed to obtain the correction data with respect to a gray scale property.

As the correction data at this time, it is possible to use first calibration data that has been obtained in a calibration operation performed right after turning ON a power source of the device, so that it is not necessary to frequently perform the calibration operation unlike conventional techniques.

Further, influences of the short-time variation of the resistance value of the thin film transistor are not accumulated, so that there is no possibility that the variation is so large that it is difficult to restore the variation. Thus, it is possible to obtain the reliability kept for an extended period of time.

Therefore, it is possible to perform image reading stably for an extended period of time. As a result, it is possible to obtain such advantage that the operability and the reliability of the image reading device are improved.

Moreover, within a period constituted of the first step to the third step for image reading, i.e., within a period in which the third step shifts to the first step of the next cycle, the voltage having the opposite polarity is applied, so that the application of the voltage does not influence the image reading.

Thus, even in the case where images are sequentially read, the application of the voltage does not influence the image reading, so that it is possible to perform the image reading stably. As a result, it is possible to improve the operability and the reliability of the image reading device.

The fourth step may be carried out once in a plurality of cycles.

In this case, it is possible to shorten a period from the third step (excluding the fourth step) to the first step of the next cycle, so that when images are sequentially read, it is possible to give continuity to the read images until the fourth step is carried out.

As described above, when the thin film transistor is used as a photodetecting element, it is necessary to suppress the short-time variation of the resistance value of the thin film transistor so as not to exceed 10% in consideration for the photodetection accuracy.

Then, in order to suppress the short-time variation of the resistance value of the thin film transistor so as not to exceed 10%, the following procedure is performed.

A time in which the voltage is applied to the gate electrode in the fourth step is set so that a rate indicating relative variation of a bright current of the thin film transistor is within a range of from 0.9 to 1.1.

Further, the fourth step is carried out in a period whose length is 3% to 30% with respect to an entire period in which the thin film transistor is driven.

Further, the cycle is set to 0.1 Hz to 10 Hz.

Further, the thin film transistor may function as both a pixel selection element and the photodetecting element.

In this case, it is possible to realize an image reading device, having a simple structure, which realizes highly-fine image reading, and it is also possible to improve the operability and the reliability of the device.

Further, a potential of the voltage applied to the gate electrode in the arbitrary period may be set to be equal to a potential of a voltage making the thin film transistor in the ON state.

In this case, a potential of the voltage applied to the gate electrode in the arbitrary period may be set to be equal to a potential of a voltage making the thin film transistor in the ON state, so that the voltage applied to the gate electrode can be used as both (i) the voltage making the thin film transistor in the ON state and (ii) a voltage which functions as the compensation signal.

Thus, it is not necessary to switch the voltage in a complicate manner, so that it is possible to simplify the structure of the driver for driving the gate electrode. As a result, it is possible to miniaturize the device and to reduce the power consumption.

Further, application of the voltage to the gate electrode that should be performed in the fourth step may be performed not in the fourth step but in a period in which the storage capacitor is charged with a predetermined amount of electric charge in the first step of the next cycle.

In this case, it is not necessary to provide a period for carrying out the fourth step, so that it is possible to shorten a period from the third step to the first step of the next cycle.

Thus, when images are sequentially read, it is possible to improve the reading speed, and it is also possible to improve the operability of the device.

For a fuller understanding of the nature and advantages of the invention, reference should be made to the ensuing detailed description taken in conjunction with the accompanying drawings.

BEST MODE FOR CARRYING OUT THE INVENTION

Before describing an embodiment of the present invention, a principle of the present invention will be described as follows with reference to FIG. 28 to FIG. 31.

The present inventors supposed that: it is possible to prevent the aforementioned problem, that is, "variation of the TFT resistance value that is observed in a short time" by applying a voltage (a compensation signal or a compensation pulse), whose polarity is opposite to average polarity of a bias applied to a gate electrode while the device is operating, to the gate electrode as in the case of preventing the TFT Vth shifting which is conventionally observed in using it for an extended period of time, and the present inventors performed the following basic experiment.

Figure 28:
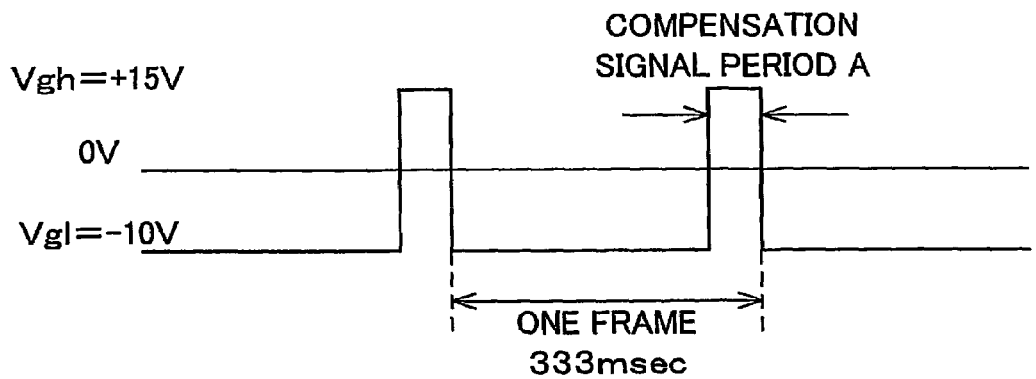
FIG. 28 is a timing chart showing timing at which a compensation signal is inputted.

FIG. 28 shows a signal waveform of a voltage applied to the gate electrode of the photodetecting TFT as an experiment. The signal waveform shows such condition that: a compensation signal, whose polarity is opposite to that of an OFF voltage (Vg1) applied to the gate electrode, is applied once in a single frame (3 frames occur in every second). In the present experiment, a period in which the compensation signal having the opposite polarity is applied (compensation signal period) A is used as a parameter so as to observe the resistance value variation of the TFT.

Figure 30:
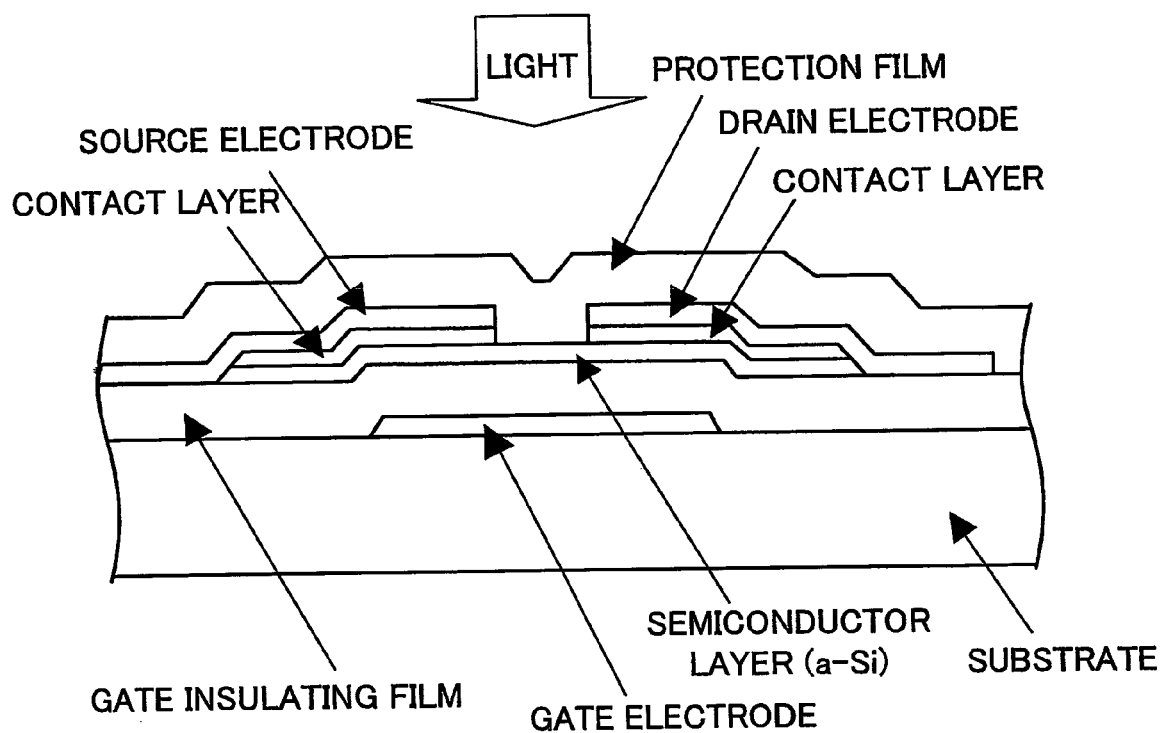
FIG. 30 is a cross sectional view schematically showing a TFT used to derive the graph shown in FIG. 29.

Note that, the photodetecting TFT used in the present experiment is a bottom-gate-type TFT as shown in FIG. 30. That is, the gate electrode is provided on a substrate constituted of a glass substrate and the like, and the gate insulating film is formed on the gate electrode, and a semiconductor layer (a-Si) is formed on the gate insulating film as a photosensitive semiconductor film which functions as the aforementioned channel section, and a contact layer, a source electrode, and a drain electrode are formed on the semiconductor layer. Further, a protection film is formed so as to entirely cover the photodetecting TFT.

Figure 29:
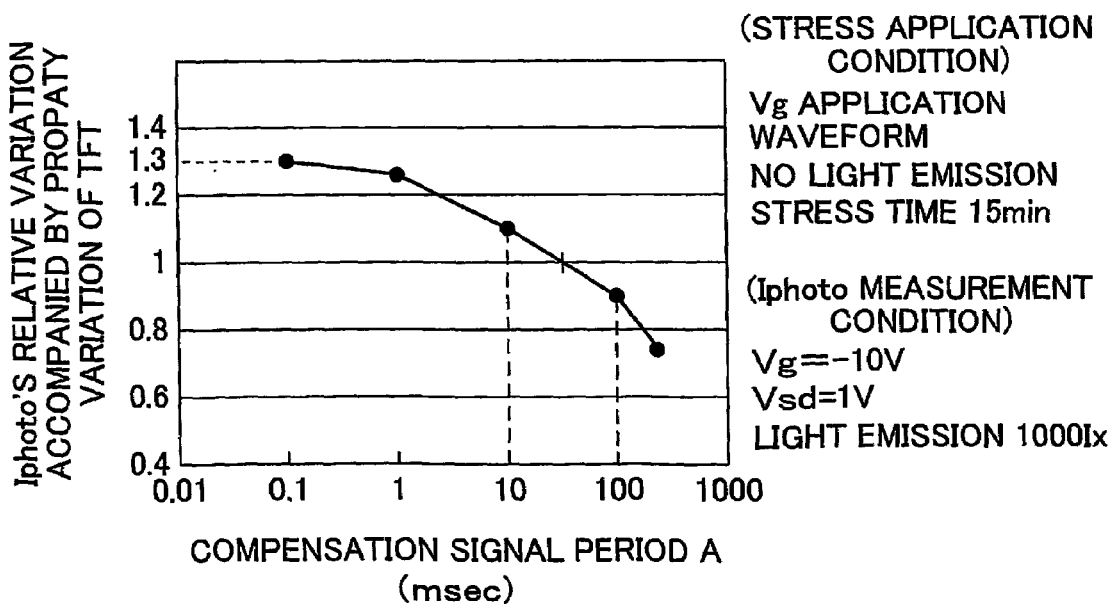
FIG. 29 is a graph showing a relationship between (i) a compensation signal period and (ii) relative variation of I photo that is accompanied by variation of a TFT property.

FIG. 29 is a graph showing relative variation of a bright current (I photo), accompanied by property variation (resistance value variation) of the photodetecting TFT arranged as shown in FIG. 30, before and after applying the signal whose signal waveform is shown in FIG. 28. In this graph, a lateral axis shows the compensation signal period A, and a vertical axis shows the relative variation of the bright current (I photo) of the TFT.

Note that, a value of the bright current (I photo) of the photodetecting TFT is a value in a case where a gate voltage Vg of the photodetecting TFT is −10V and a source-drain voltage Vsd of the photodetecting TFT is 1V and light emission from the photodetecting TFT to the channel section is 1000lx. Further, a condition under which the signal waveform shown in FIG. 28 is applied (stress applying condition) is such that: a voltage indicated by the signal waveform is continuously applied for 15 minutes without light emission.

As apparent from the graph shown in FIG. 29, it was found that: by setting the compensation signal period A to 10 to 100 msec, preferably more or less than 33 msec, it was possible to suppress the relative variation of the bright current (I photo) of the photodetecting TFT so as not to exceed 10% with respect to the signal application to the gate electrode that was performed for 15 minutes. Note that, it was experimentally found that: variation in the first 15 minutes was large, and the variation tended to be saturated after the first 15 minutes.

In other words, it is preferable to set a waveform indicating a voltage inputted to the gate electrode so that time in which the compensation signal (opposite polarity) is applied is 3 to 30%, preferably approximately 10% with respect to one frame period.

Figure 31:
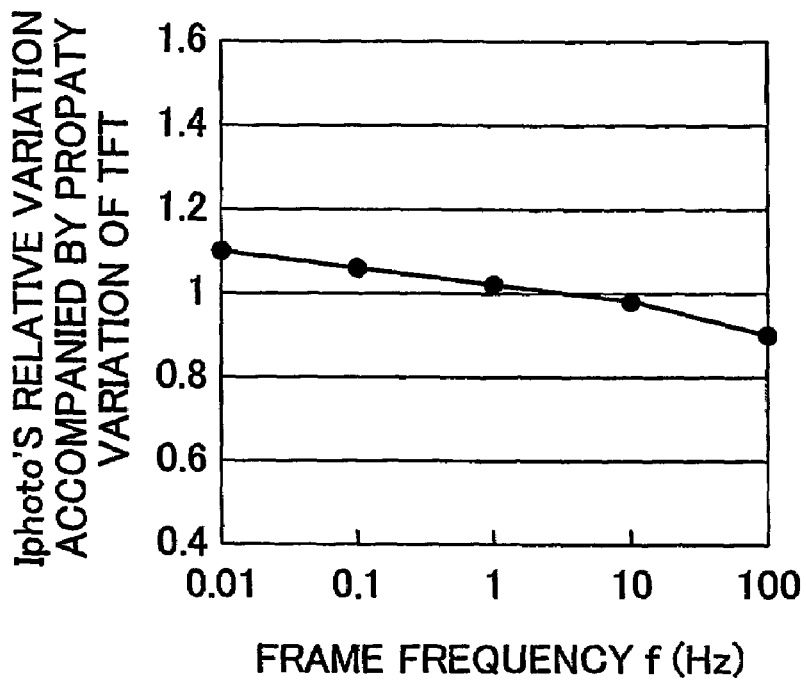
FIG. 31 a graph showing a relationship between (i) a frame frequency and (ii) relative variation of I photo that is accompanied by variation of the TFT property.

Next, the same experiment was performed except that a duty ratio is fixed so that the compensation signal period A with respect to each frame period was 1/10 and the frame frequency was used as a parameter. At this time, the voltage Vg was continuously applied for 15 minutes without light emission, and a condition under which I photo was measured was the same as the condition shown in FIG. 29. As a result, it was found that: as shown in FIG. 31, at 0.1 Hz to 10 Hz regarded as a practically readable cycle in performing the image reading, the relative variation of the bright current (I photo) of the photodetecting TFT was kept in the substantially same condition.

Thus, the following property was confirmed: in the photodetecting TFT, the voltage Vg1 is applied to the gate electrode so as to turn OFF the photodetecting TFT in an ordinary state, but by adopting such sequence that the compensation signal of 3 to 30%, preferably approximately 10%, which had opposite polarity, is applied, it was possible to suppress the unfavorable resistance value variation of the photodetecting TFT which was observed in a short time.

Note that, the application period of the compensation signal that has been calculated here does not need to be provided in each frame, but a plurality of application periods may be provided in each frame, or a single application period may be provided in a plurality of frames. That is, the compensation signal is applied to the gate electrode for a period of 3% to 30% as an average, preferably approximate 10%, with respect to an entire period in which an image is read by using the photodetecting TFT (entire period in which the photodetecting TFT is driven).

The following description will explain an example where the present invention is specifically applied to a device.

Embodiment 1

One embodiment of the present invention is described below.

Note that, the present embodiment describes an example where an image reading device of the present invention is applied to a two-dimensional image sensor.

First, a photodetecting TFT (photosensor) used in the two-dimensional image sensor is described, and next, the two-dimensional image sensor will be described.

Figure 3:
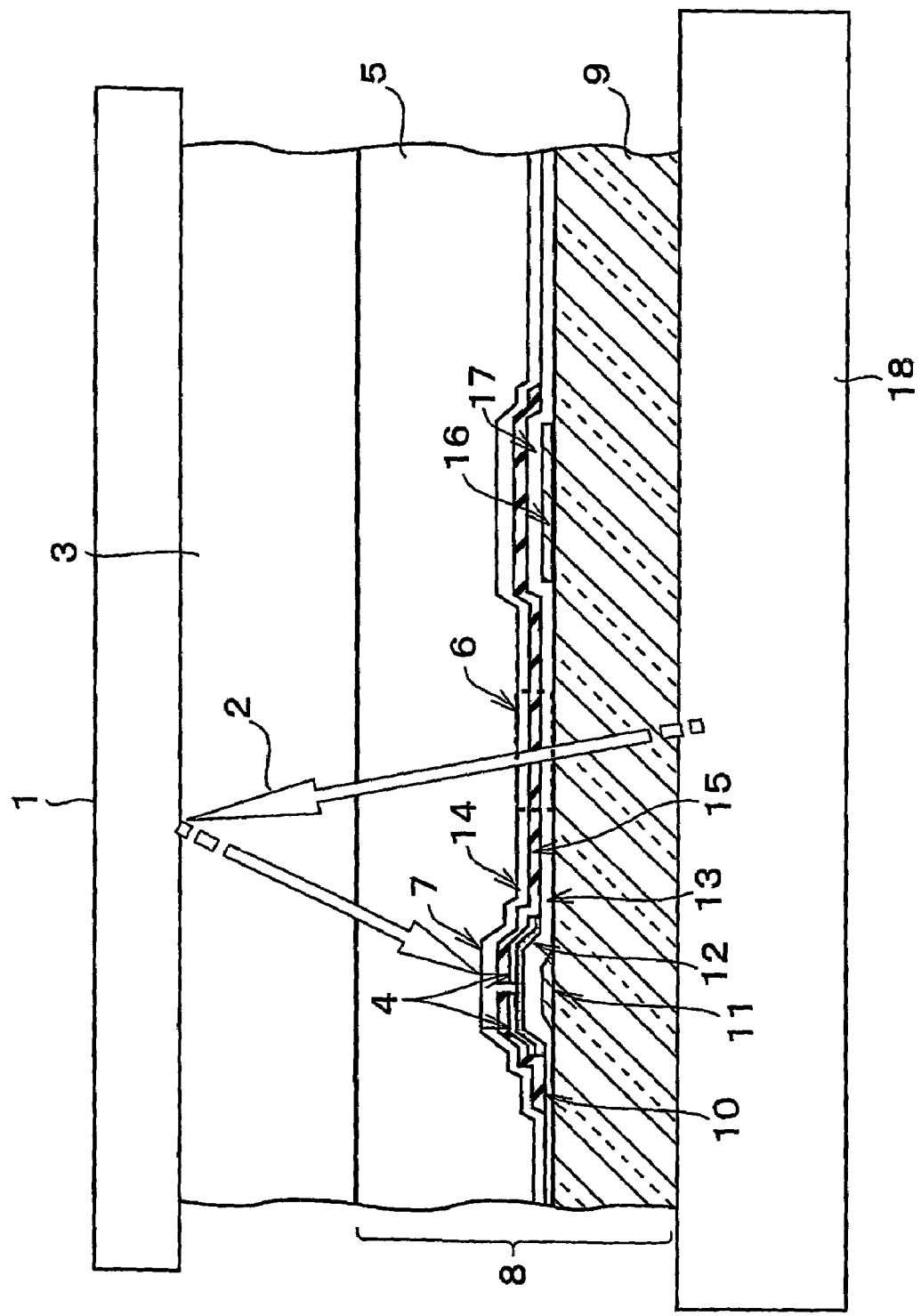
FIG. 3 is a cross sectional view schematically showing an arrangement of the image reading device shown in FIG. 1.

The photosensor is basically an inversely staggered thin film transistor (TFT) (as long as an upper gate electrode is made of light-transmission material, the photosensor may be the inversely staggered thin film transistor). That is, as shown in FIG. 3, the photodetecting TFT 7 is arranged so that: a bottom gate electrode 11 made of alminium (Al), tantalum (Ta), and the like is formed on an insulating substrate (transparent substrate) 9 made of glass and the like, and a gate insulating film (protection film) 13 made of silicon nitride (SiN) is formed so as to cover the bottom gate electrode 11 and the insulating substrate 9.

On the bottom gate electrode 11, a semiconductor layer (photosensitive semiconductor layer) 12 made of i-type amorphous silicon (i-a-Si) so as to be positioned opposite to the gate electrode 11, and above the semiconductor layer 12, a source electrode 10 and a drain electrode 15 are formed so as to be positioned opposite to each other with a predetermined gap therebetween.

The source electrode 10 and the drain electrode 15 are respectively connected to the semiconductor layer 12 via an n+silicon layer 4.

On the source electrode 10 and the drain electrode 15, a protection insulating film 14 is formed, and these members constitute a transistor (inversely staggered thin film transistor).

Emission light 2 is emitted from a back light unit 18 on the side of the insulating substrate 9 to the photodetecting TFT 7, and the emission light 2 is transmitted through an opening section 6, and is reflected by a document 1, so that the emission light 2 is emitted to the semiconductor layer 12.

Further, the photodetecting TFT 7 controls a voltage applied to the bottom gate electrode 11, so that it is possible to control a conduction state or a non-conduction state. For example, when a positive voltage is applied to the bottom gate electrode 11 of the photodetecting TFT 7, an n channel is formed in the semiconductor layer 12, and when a voltage is applied to a gap between the source electrode 10 and the drain electrode 15, a current flows.

Figure 32:
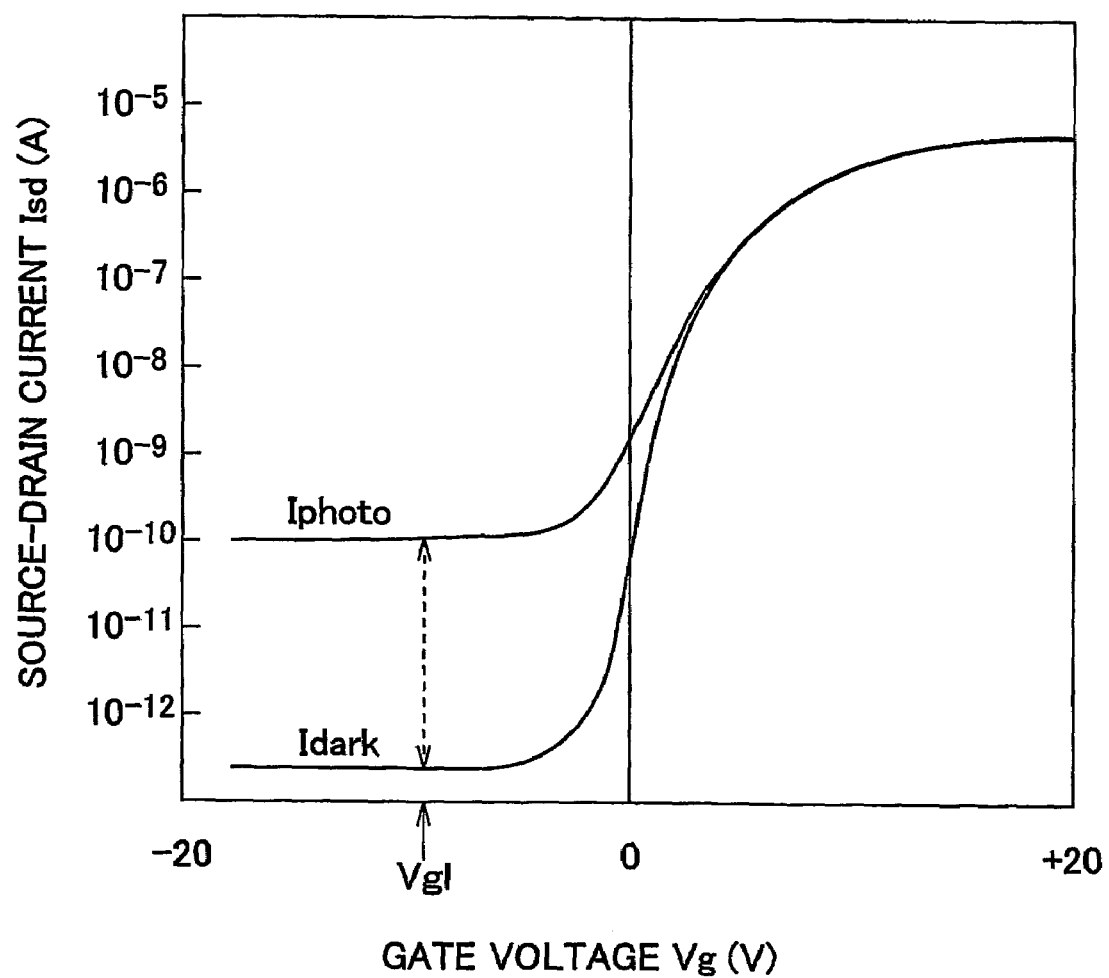
FIG. 32 is a graph showing properties of a gate current and a source-drain current of the TFT in case where light is emitted.

A relationship between a gate voltage of the photodetecting TFT 7 and a source-drain current is as shown in the graph of FIG. 32.

Next, the two-dimensional image sensor using the photodetecting TFT 7 arranged in the foregoing manner is described with reference to FIG. 2.

Figure 2:
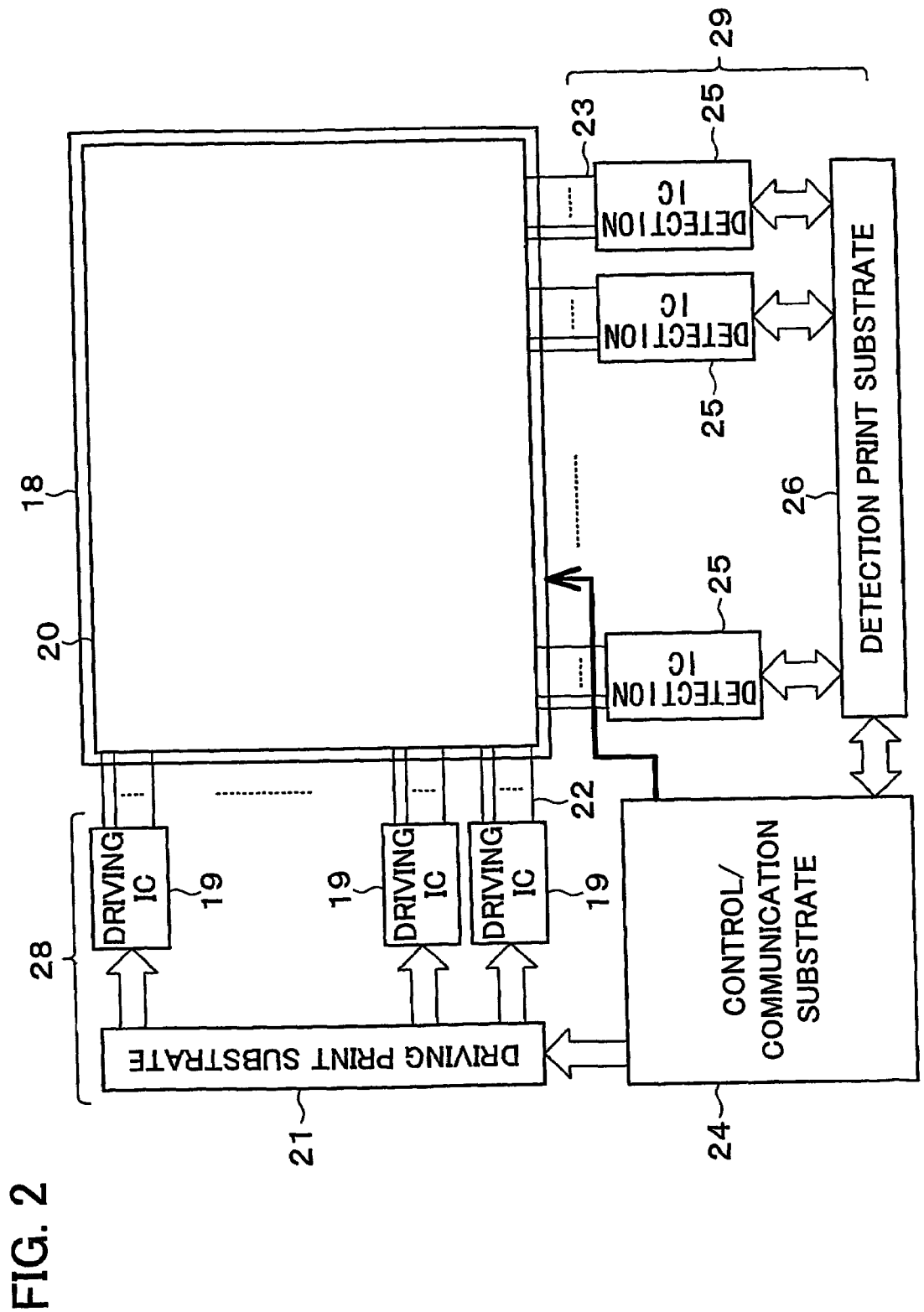
FIG. 2 is a block diagram schematically showing an arrangement of a two-dimensional image sensor provided with the image reading device shown in FIG. 1.

FIG. 2 is a block diagram schematically showing an arrangement of the two-dimensional image sensor. Note that, the two-dimensional image sensor described here is a contact-type image sensor. Further, the present embodiment describes the two-dimensional image sensor, but the image reading device of the present invention may be a one-dimensional image sensor.

As shown in FIG. 2, the two-dimensional image sensor according to the present embodiment includes: a plurality of pixels (not shown) disposed in a matrix manner; and a sensor substrate (photoelectric transfer element) 20, constituting a sensor section (photosensor), which is in a shape of a flat plate, wherein a plurality of driving ICs (driving means) 19 . . . and a plurality of detection ICs (photoelectric transfer amount detecting means) 25 . . . are connected to a periphery of the sensor substrate 20.

Each driving IC 19 drives the photodetecting TFT 7 (see FIG. 1), provided on each pixel of the sensor substrate 20, that will be described later, and is connected to each of gate lines 22 . . . provided on the sensor substrate 20. The number of the gate lines 22 . . . varies depending on a size and a pixel pitch of the sensor substrate 20. However, the number of the gate lines 22 . . . ranges from several hundreds to several thousands, and a plurality of the driving ICs 9 . . . detect output from the gate lines 22 . . . . In this case, the number of outputs of each driving IC 19 is several hundreds for example.

The driving ICs 19 are mounted on a driving print substrate 21, and the driving ICs 19 and the driving print substrate 21 constitute a driving circuit 28.

The driving print substrate 21 is connected to a control/communication substrate (including light emission controlling means) 24, and includes a circuit which controls the driving ICs 19 and functions as an interface of the control/communication substrate 24.

While, each of detection ICs 25 detects an output from the sensor substrate 20 that has been obtained as a result of driving of the photodetecting TFT 7 provided on the sensor substrate 20. The detection ICs 25 are connected to data lines 23 . . . of the sensor substrate 20. Also the number of the data lines 23 . . . varies depending on the size and the pixel pitch of the sensor substrate 20. However, the number of the data lines 23 . . . ranges from several hundreds to several thousands, and a plurality of the detection ICs 25 . . . detect output from the data lines 23 . . . . The number of inputs of each detection IC 25 is several hundreds for example.

The detection ICs 25 are mounted on a detection print substrate (image information outputting means) 26, and the detection ICs 25 and the detection print substrate 26 constitute a detection circuit (detecting means) 29.

The detection print substrate 26 is connected to the control/communication substrate 24, and includes a circuit which controls the detection ICs 25 and functions as an interface of the control/communication substrate 24.

The control/communication substrate 24 includes a circuit, such as a CPU and a memory, which deals with a signal which does not synchronize with (a) line reading scanning and (b) a frame cycle of the sensor substrate 20, and the control/communication substrate 24 communicates with external circuits and controls the photoelectric transfer device entirely.

A back light unit 18 is constituted of an LED, a light guiding plate, and a light diffusing plate.

Turning ON/OFF of the LED is controlled by the control/communication substrate 24.

Figure 4:
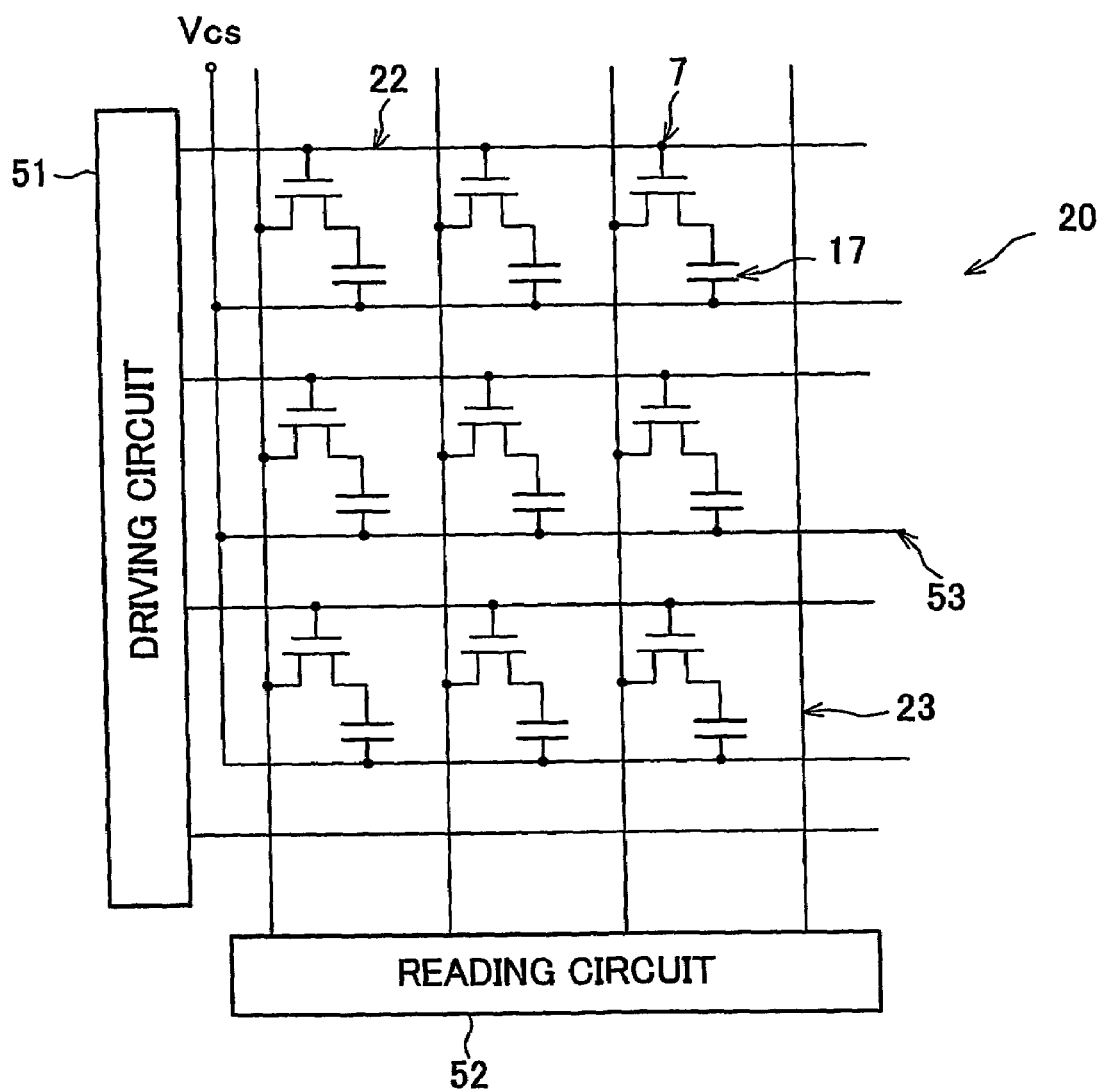
FIG. 4 is a block diagram schematically showing a sensor substrate provided on the two-dimensional image sensor shown in FIG. 2.

As shown in FIG. 4, the sensor substrate 20 is not arranged so that the switching TFT and the photodetecting TFT are disposed in each pixel but is arranged so that a single thin film transistor (photodetecting TFT 7) functions as both the switching TFT and the photodetecting TFT.

Thus, in the sensor substrate 20, a single thin film transistor functions as both (i) the switching TFT for selecting a pixel and (ii) the photodetecting TFT for functioning as a photo sensor.

In the sensor substrate 20, as shown in FIG. 2, the driving circuit 51 is constituted of the driving print substrate 21 and the driving ICs 19 . . . , and the reading circuit 52 is constituted of the detection print substrate 26 shown in FIG. 2 and the detection ICs 25 . . . , and a gate electrode of each photodetecting TFT 7 is connected to the gate line 22, and a source electrode of each photodetecting TFT 7 is connected to the data line 23. Note that, in the sensor substrate 20 shown in FIG. 4, there is provided a capacitor wiring 53 connected to the pixel capacitor 17 which functions as an electric charge storage capacitor. Further, the capacitor wiring 53 is connected to a power source (Vcs), and is used in precharging the pixel capacitor 17 described later.

In the sensor substrate 20, as shown in FIG. 4, a single photodetecting TFT 7 which functions as both (i) the switching TFT and (ii) the photosensor and a single pixel capacitor 17 are disposed in each pixel.

The following description will detail the detection IC 25 which constitutes the reading circuit 52.

Figure 1:
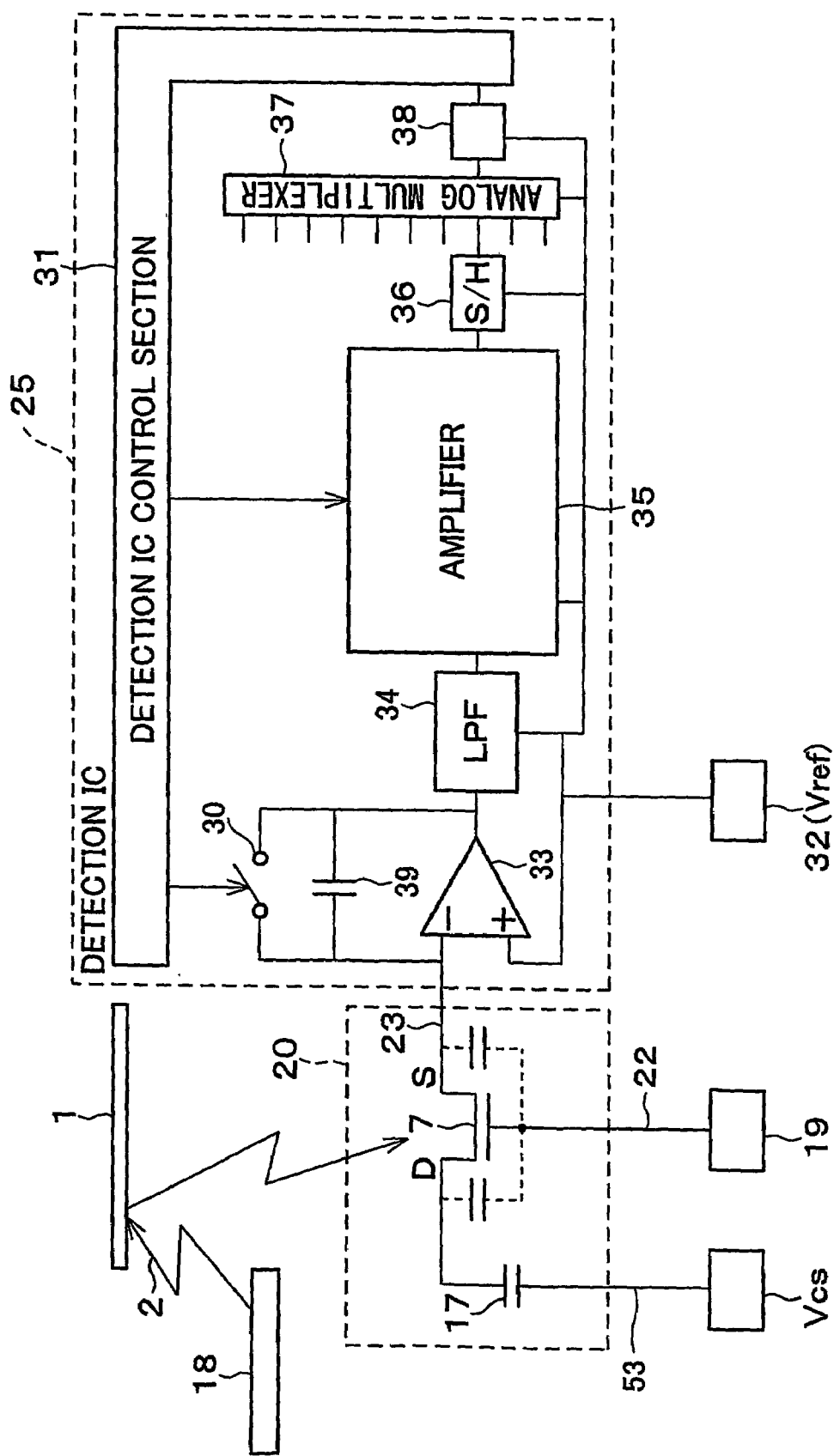
FIG. 1 is a block diagram schematically showing an arrangement of an image reading device according to one embodiment of the present invention.

As shown in FIG. 1, each of the detection ICs 25, which are prepared corresponding to the number of detected lines (several hundreds lines for example), internally includes an integration amplifier 33, a low pass filter 34, an amplifier 35, a sample hold circuit 36, and the like, and there are provided an analog multiplexer 37 and an A/D (analog/digital) converting circuit 38 at the following stage of the sample hold circuit 36.

Further, in the detection IC 25, dual mutual sampling is performed so as to remove offsetting and noise of each circuit.

In the detection IC 25 arranged in this manner, electric charge of the auxiliary capacitor 17 that has been inputted via the data line 23 to the detection IC 25 is, first, inputted to the integration amplifier 33 as negative input, so that the integration amplifier 33 outputs a potential in proportion to the inputted electric charge. Further, a reference voltage (Vref) 32 is inputted to the integration amplifier 33 as positive input.

Output of the integration amplifier 33 is inputted to the amplifier 35 via the low pass filter 34 provided to reduce the noise, and is amplified by a predetermined scale factor, and is then outputted.

Further, the output of the amplifier 35 is inputted to the sampling hold circuit 36, and is temporarily stored there, and a value of the stored output is outputted to one of a plurality of inputs of the analog multiplexer 37.

The output of the analog multiplexer 37 is inputted to the A/D converting circuit 38 positioned at the next stage, and the output is converted from analog data to digital data in the A/D converting circuit 38, and the converted data is outputted to the control/communication substrate 24 as image data.

Further, the integration amplifier 33 has a reset switch 30, and the reset switch 30 is controlled by output of the control section 31 of the detection IC 25. The control section 31 controls the detection IC 25 and functions as an interface of the detection print substrate 26.

Here, the photodetecting TFT 7 arranged in the foregoing manner is driven as follows.

That is, in the photodetecting TFT 7, as shown in FIG. 3, emission light 2 is emitted from the back light unit 18 on the side of the insulating substrate 9, and the emission light 2 is transmitted through the opening section 6, and is reflected by the document 1, and is emitted to the semiconductor layer 12 having photosensitivity.

Here, the photodetecting TFT 7 can control its conduction state (ON)/non-conduction state (OFF) by controlling a voltage applied to the bottom gate electrode 11. For example, when a positive voltage is applied to the bottom gate electrode 11 of the photodetecting TFT 7, an n-channel is formed in the semiconductor layer 12, and when a voltage is applied between the source electrode 10 and the drain electrode 15, a current flows therebetween.

Further, when emitting light in the non-conduction state (a state in which a negative voltage is applied to the gate electrode), a light current is induced in the semiconductor layer 12, so that a drain current (I photo) corresponding to the number of electron holes induced by the emission light, i.e., corresponding to light volume of the emission light, flows between the source electrode 10 and the drain electrode 15. That is, a resistance value between the source and the drain drops. While, when light is not emitted (OFF), the drain current (I dark) is extremely small, for example, is approximately $10^{-14}$ A (ampere).

Here, a voltage from the driving IC 19 is applied to the gate line connected to the gate electrode of the photodetecting TFT 7, and a property of the resistance value of the photodetecting TFT 7 varies, so that, in an ordinary state, a voltage whose polarity causes an OFF state is applied and a voltage having opposite polarity (compensation signal) is applied once in each frame for a predetermined period. This will be detailed later.

Figure 5:
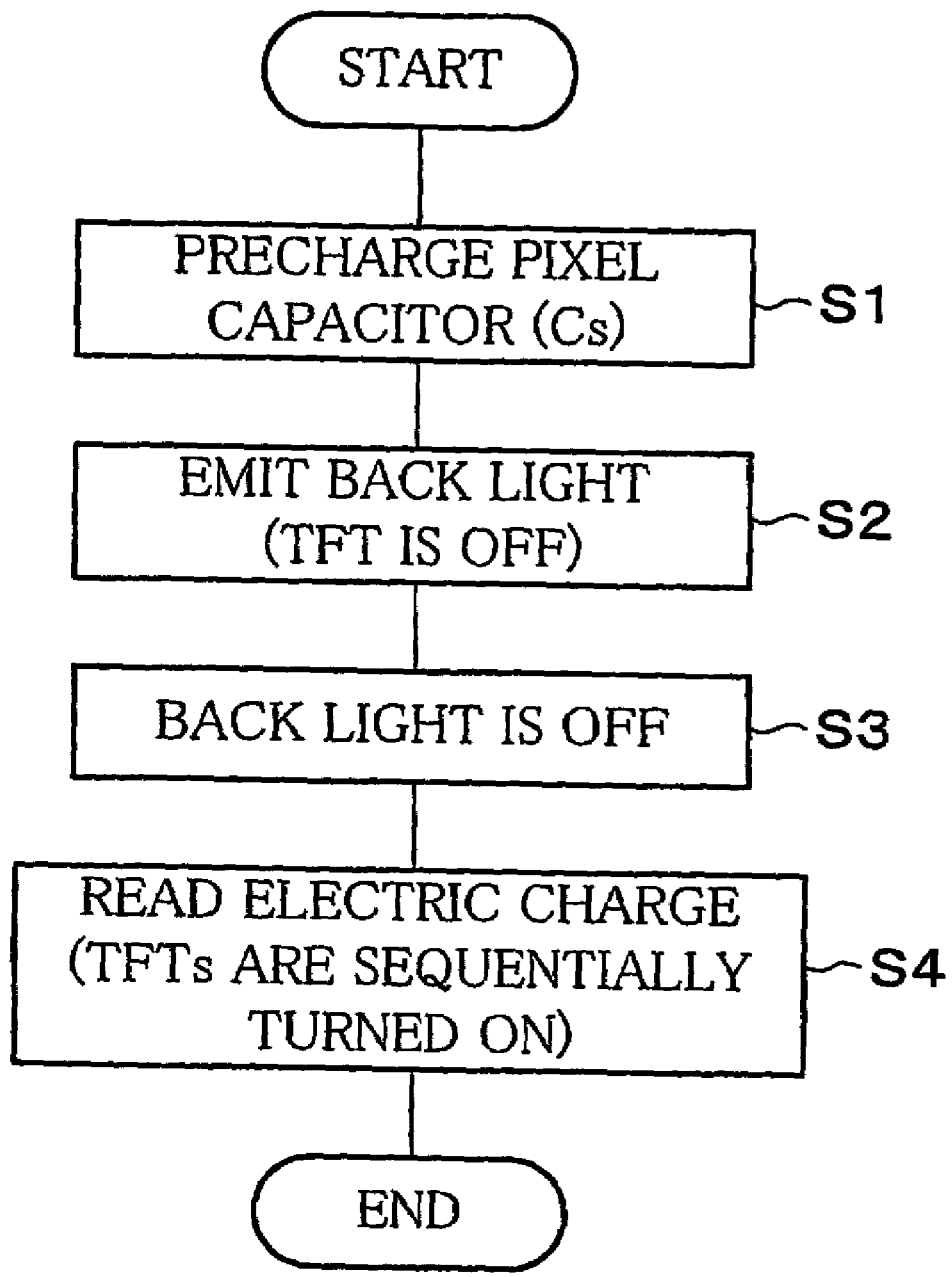
FIG. 5 is a flow chart of the reading operation of the image reading device shown in FIG. 1.

Next, operations of the two-dimensional image sensor arranged in the foregoing manner are described as follows with reference to FIG. 5. FIG. 5 is a flow chart showing how the two-dimensional image sensor operates.

First, the pixel capacitor (Cs) 17 is precharged (step S1). Here, the pixel capacitor (storage capacitor) 17 is precharged by using the data line 23 or the capacitor wiring 53. Note that, in case of precharging the pixel capacitor 17 by using the data line 23, it is necessary to turn ON the photodetecting TFT 7.

Next, the back light is emitted (step S2). Here, light (for example, light reflected by the document) is emitted to the sensor substrate 20 for a predetermined period by means of the back light unit under such condition that the photodetecting TFT 7 is turned OFF. As a result, due to such a property that a current flowing between the source and the drain (bright current I photo) increases only in a part to which the light is emitted (that is, due to a property reducing the resistance), the electric charge of the pixel capacitor 17 that has been pre-charged is discharged. While, in a part to which the light is not emitted, the electric charge of the pixel capacitor 17 is maintained.

Next, the back light is turned OFF (step S3).

Further, the electric charge is read (step S4). That is, the light emission to the sensor substrate 20 is stopped, and the photodetecting TFTs 7 are sequentially turned ON, so that electric charge remaining in the pixel capacitor 17 is read, and plane distributions of image information are read. This operation is performed in the detection IC 25 which constitutes the aforementioned reading circuit 52.

A procedure in which the two-dimensional image sensor arranged in the foregoing manner is driven is such that: as shown by the flow chart of FIG. 5, the aforementioned basic steps S1 to S4 are performed, so that it is possible to obtain two-dimensional distributions of light, i.e., image information of the document. Further, these operations are repeatedly performed, so that it is also possible to perform sequential image reading.

Here, the step S1 corresponds to a first step for charging the pixel capacitor 17 functioning as the storage capacitor to a predetermined level, and the step S2 corresponds to a second step for turning OFF the photodetecting TFT 7 so as to discharge the electric charge from the pixel capacitor 17 that has been charged due to the emission light to the photodetecting TFT 7.

Further, the steps S3 and S4 correspond to a third step for calculating the electric charge of the pixel capacitor 17 in accordance with the discharge amount so as to detect a photoelectric transfer amount of the sensor substrate 20 which functions as a photoelectric transfer element.

Further, when the foregoing three steps (the first step to the third step) are regarded as one cycle of image reading, a voltage whose polarity is opposite to average polarity of a voltage making the photodetecting TFT 7 in the OFF state is applied to the gate electrode of the photodetecting TFT 7 within a period in which the third step shifts to the first step of the next cycle.

Figure 6:
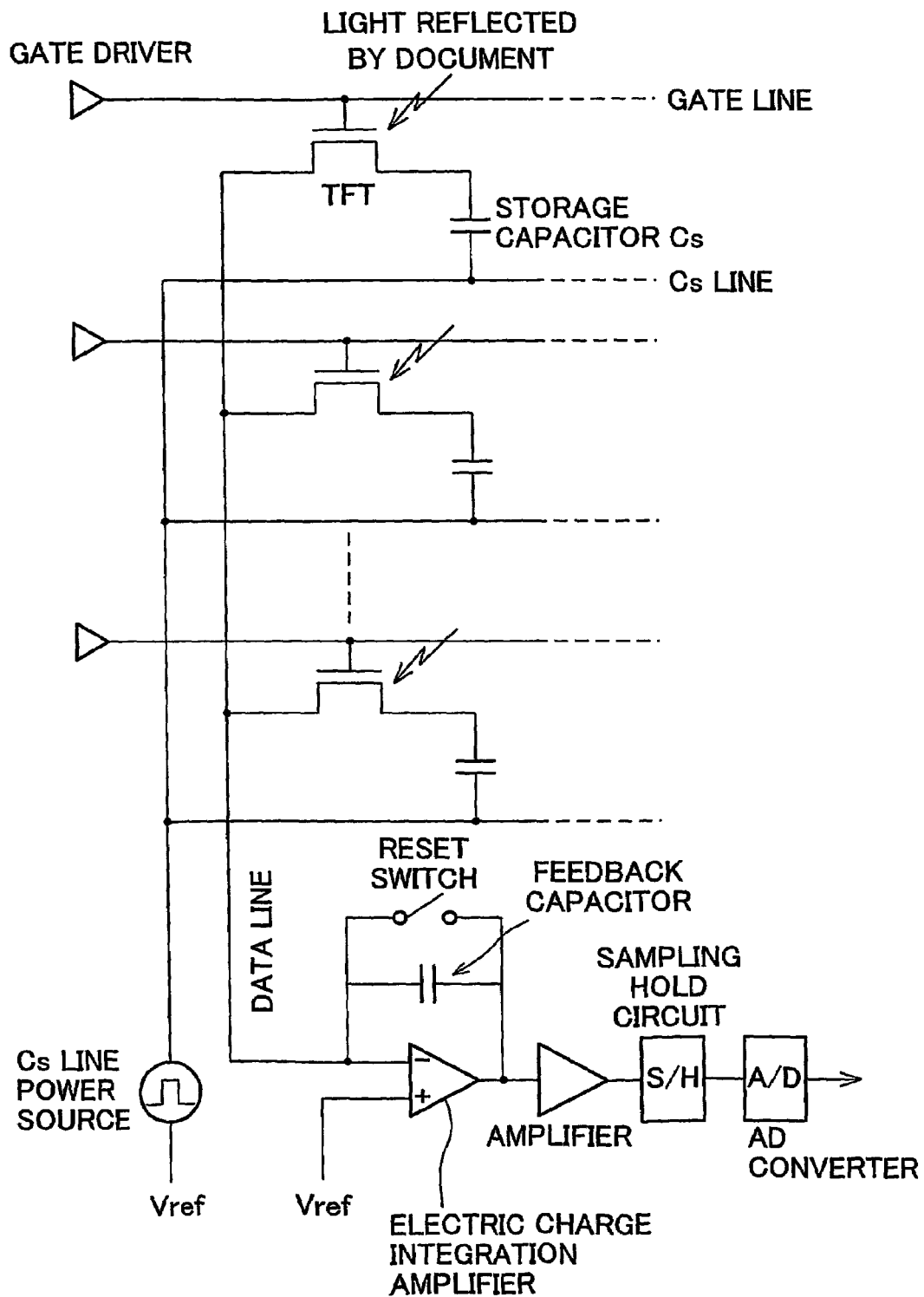
FIG. 6 is an equivalent circuit diagram of the two-dimensional image sensor shown in FIG. 2.

Here, operations of the two-dimensional image sensor arranged in the foregoing manner are detailed as follows with reference to FIG. 6 to FIG. 9. FIG. 6 focuses on a single data line in the equivalent circuit such as the image reading device shown in FIG. 4 and shows not only the data line but also reading circuit portions in detail.

First, as shown in FIG. 6, each of the reading circuits (detection ICs), constituting the two-dimensional image sensor, which are prepared corresponding to the number of detected lines (several hundreds lines for example), internally includes an electric charge integration amplifier, an amplifier, a sample hold circuit, and the like, and there is provided an A/D (analog/digital) converting circuit 1, via an analog multiplexer (corresponding to 37 shown in FIG. 1), that is positioned at the following stage of the sample hold circuit. Output of the electric charge integration amplifier is inputted to the amplifier, and is outputted after being amplified by a predetermined scale factor.

A low pass filter (corresponding to 34 shown in FIG. 1) for removing noise components is inserted between the electric charge integration amplifier and the amplifier. The low pass filter may be inserted or may be omitted.

Output of the amplifier is inputted to the sampling hold circuit, and is temporarily stored there, and a value of the stored output is outputted to one of a plurality of inputs of the analog multiplexer. The output of the analog multiplexer is inputted to the A/D converting circuit positioned at the next stage, and the output is converted from analog data to digital data in the A/D converting circuit, and the converted data is externally outputted.

Figure 7:
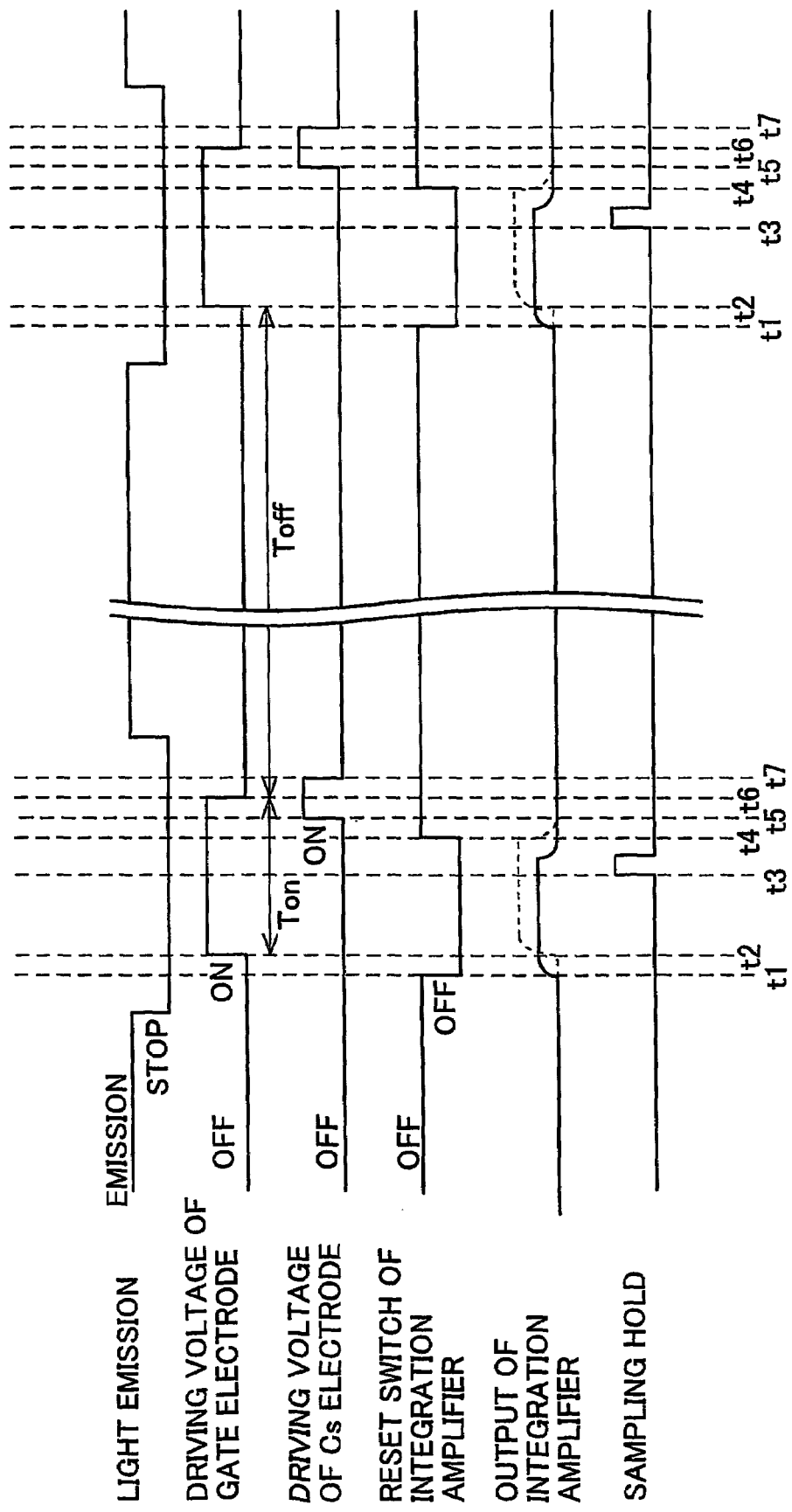
FIG. 7 is a timing chart of a reading operation of the image reading device shown in FIG. 1.

Next, with reference to FIGS. 6 and 7, the following description will explain a specific example of how the two-dimensional image sensor arranged in the foregoing manner operates over time. FIG. 7 is a time chart concerning the respective portions. Here, each operation performed in each time that corresponds to each step shown in FIG. 4 is described. Note that, for convenience in description, hereinafter, the photodetecting TFT 7 is referred to as merely as TFT.

(1) Step S1: time t4 to time t7

Since the reset switch of the electric charge integration amplifier is ON at time t4, a feedback capacitor of the electric charge integration amplifier is short-circuited, so that an output of the electric charge integration amplifier is the reference voltage (Vref). Thus, also output of the amplifier is Vref. When a Cs electrode driving voltage is applied at time t5 under such condition, electric charge flows from the storage capacitor (Cs) to the side of the drain, but the electric charge integration amplifier is reset under such condition that the TFT is ON, so that the electric charge disappears.

Figure 10:
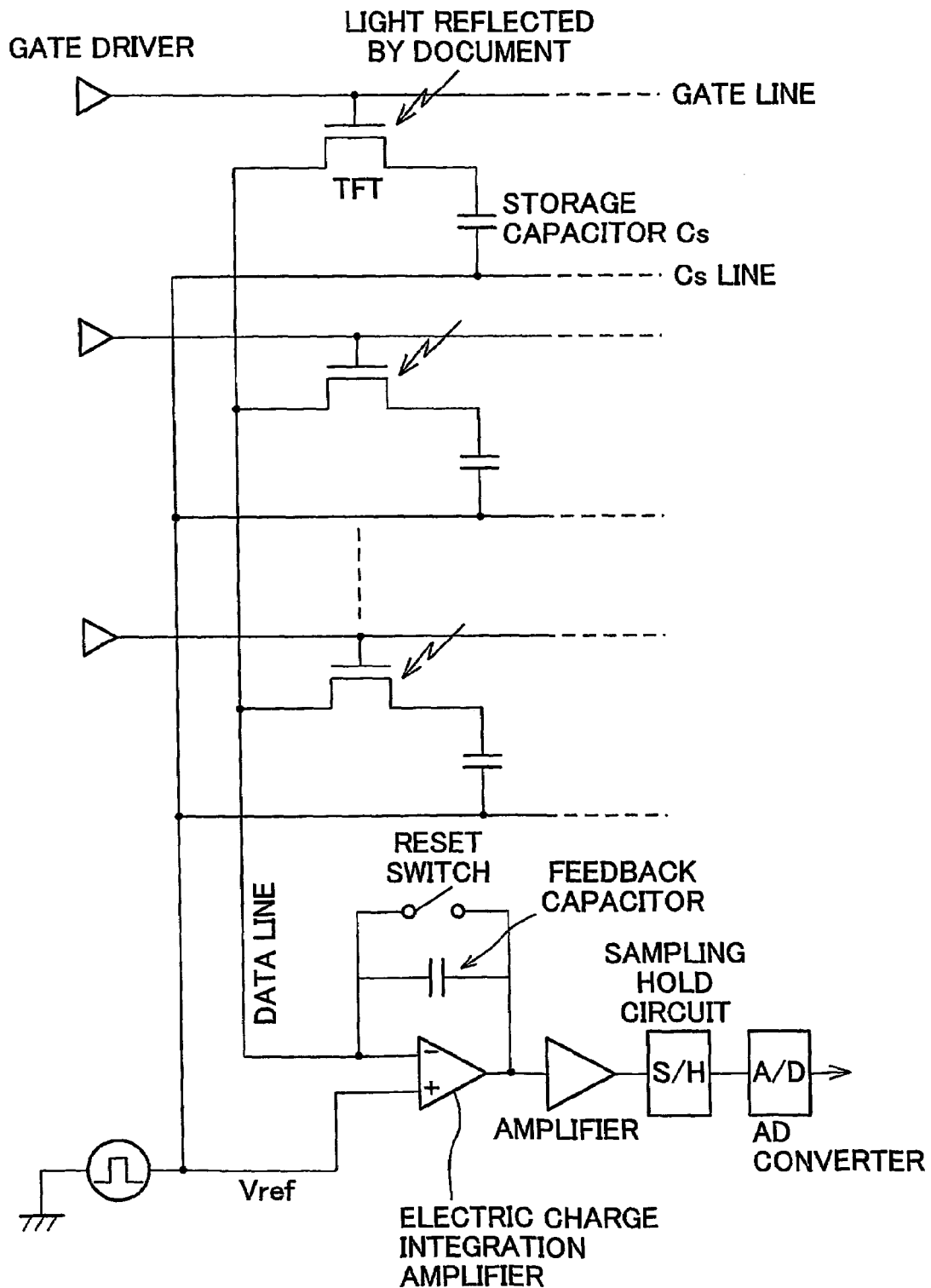
FIG. 10 is another equivalent circuit diagram of the two-dimensional image sensor shown in FIG. 2.

Next, when a gate driving signal is turned OFF at time t6, a potential of the storage capacitor (Cs) varies. That is, the storage capacitor (Cs) is precharged. Note that, FIG. 6 shows an example of the case where the storage capacitor (Cs) is precharged by driving the Cs electrode, but it is also possible to precharge the storage capacitor (Cs) by driving the reference potential (Vref) of the electric charge integration amplifier (CSA) as shown in FIG. 10.

(2) Step S2: time t7 to time t1

Electric charge of the storage capacitor charged at time t7 is kept at a time constant determined on the basis of the OFF resistance value and the storage capacitance value of the TFT from time t7 to time t1 (that is, until the next cycle). Here, light emission is performed with respect to the document for a predetermined period from time t7 to time t1.

Then, in a TFT's part to which the light is emitted, the resistance value of the TFT is made lower, so that the electric charge of the storage capacitor flows to the side of the source of the TFT, the TFT drain voltage approximates Vref. While, in a part to which the light is not emitted, the electric charge of the storage capacitor is kept so as to keep the resistance value of the TFT high, so that the TFT drain voltage is not largely varied. As a result, there occurs a difference between the part to which the light is irradiated and the part to which the light is not emitted in terms of the drain voltage (that is, an amount of the electric charges remaining in the storage capacitor) during a period from time t7 to time t1.

(3) Steps S3 and S4: time t1 to time t4

The reset switch of the electric charge integration amplifier is turned OFF at time t1, so that the electric charge integration amplifier is released from a resetting condition. The gate driving signal is applied at time t2, so that the TFT is turned ON. When the TFT is turned ON, the electric charge of the storage capacitor moves to the feedback capacitor of the integration amplifier. With this movement, output of the electric charge integration amplifier is determined. Here, as to the output of the integration amplifier, a continuous line corresponds to the part to which light is emitted, and a broken line corresponds to the part on which the light is not irradiated. Output of the amplifier is such that: an output value of the integration amplifier×G (gain), and this value is sampled at time t3. Thus, image information of the document that has been obtained during the light emission period is obtained as an electric signal. Note that, during the period, the light emission is made OFF so that the light does not influence the operations of the TFT in reading the data. After reading the data, the reset switch of the integration amplifier is turned ON.

By performing the operations (1) to (3) repeatedly, it is possible to successively obtain images. When the light is emitted, three primary colors of R, G, and B are sequentially switched and emitted, so that it is also possible to read color images.

Figure 8:
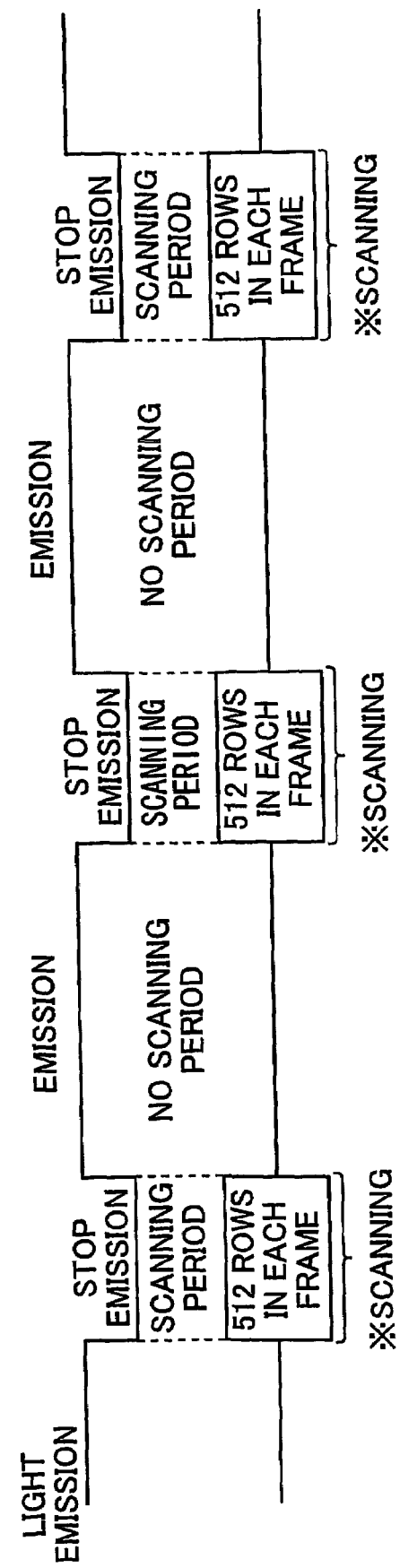
FIG. 8 shows sequence of the reading operation of the image reading device shown in FIG. 1.
Figure 9:
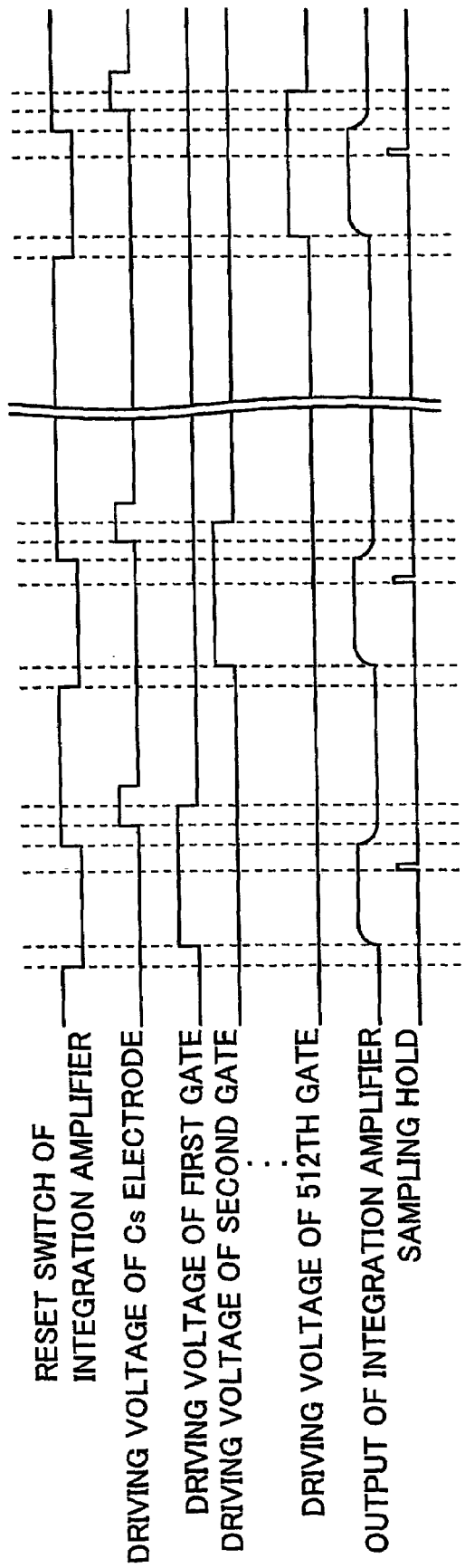
FIG. 9 is a timing chart of scanning performed in the sequence shown in FIG. 8.

Incidentally, it is general that there are a plurality of gate lines (scanning lines), so that entire sequence is as shown in FIG. 8, and its timing chart is as shown in FIG. 9. FIG. 8 shows an example of a case where there are 512 gate lines.

That is, as shown in FIGS. 8 and 9, differences are brought about in the electric charge remaining in the storage capacitor (i.e., drain voltage) during the light emission period, and the gate is made to scan in a line-sequential manner during a period in which the light emission is stopped, and output corresponding to the electric charge remaining in the storage capacitor is obtained in a sequential manner, thereby obtaining the image information. Note that, for convenience in description, the foregoing description does not mention influences caused by (i) parasitic capacitance Cgs between the gate line and the data line electrode and (ii) feedthrough (coupling effect of Cgs and Cgd with respect to variation of the gate signal).

Here, in terms of a waveform of the driving voltage of the gate that is shown in FIG. 7, an OFF period Toff in which the gate is turned OFF is set to be much longer than an ON period Ton in which the gate is turned ON in an ordinary state. This is based on the following reason: in the Toff period, a stored electric charge is discharged due to an OFF state of the TFT (that is, a high resistance state), so that a time constant required in discharging is larger. It is necessary that the Toff is approximately several hundreds msec. While, since the ON resistance value of the TFT is small in the Ton period, a time constant concerning movement of the electric charge moved by the TFT is few μsec.

Thus, dozens to 100 μsec is sufficient as Ton even when various kinds of margins are taken into consideration. Specifically, it is possible to realize the driving on the basis of such setting that: Ton/Toff=100 μsec/200 msec. That is, a period in which the ON voltage (positive bias) is applied to the gate line is an instant period, and in most of the time, the OFF voltage (negative bias) is applied. In other words, average polarity of the driving voltage is negative bias.

Figure 33:
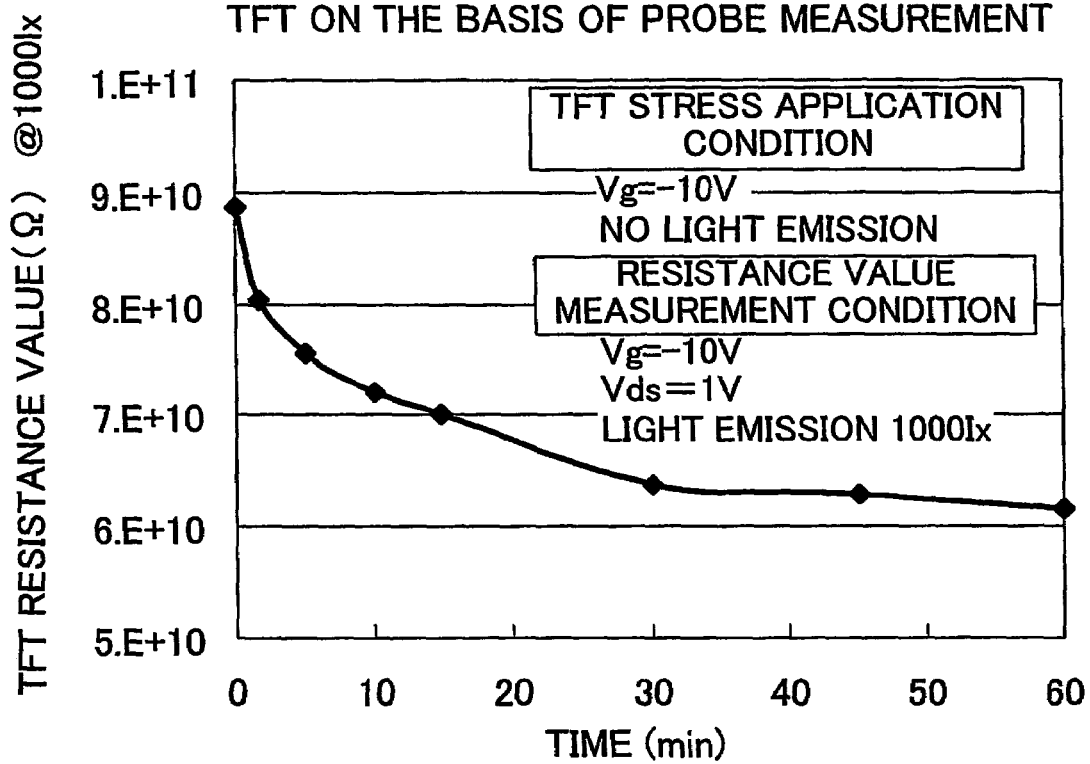
FIG. 33 is a graph showing variation-with-time of a TFT resistance value that has been measured in a single TFT on the basis of probe measurement.

In such an ordinary driving method, a bias having single polarity is effectively applied to the gate electrode, so that short-time variation of the resistance value of the photodetecting TFT obviously occurs as shown in FIG. 33. This arises a practical problem.

Then, in order to solve the problem, the present invention adopts the following compensation driving method.

The following description will explain an example of the compensation driving method of the present embodiment with reference to FIGS. 11 to 14.

Figure 11:
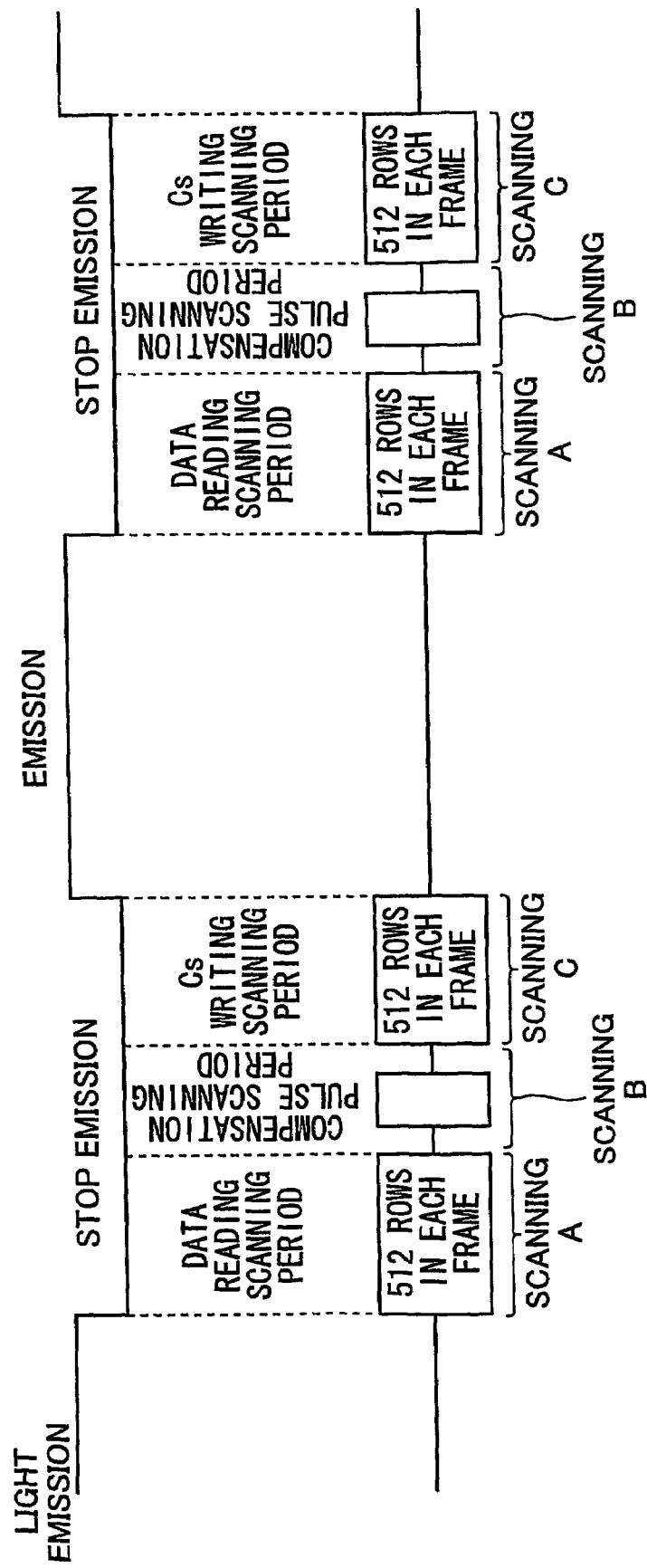
FIG. 11 shows sequence of compensation driving performed in the reading operation of the image reading device shown in FIG. 1.

FIG. 11 shows a timing chart obtained by adding a compensation driving process to the timing chart shown in FIG. 8, and is different in that: the scanning period shown in FIG. 8 is divided into "scanning A" and "scanning C", and there is provided "scanning B" therebetween.

Figure 12:
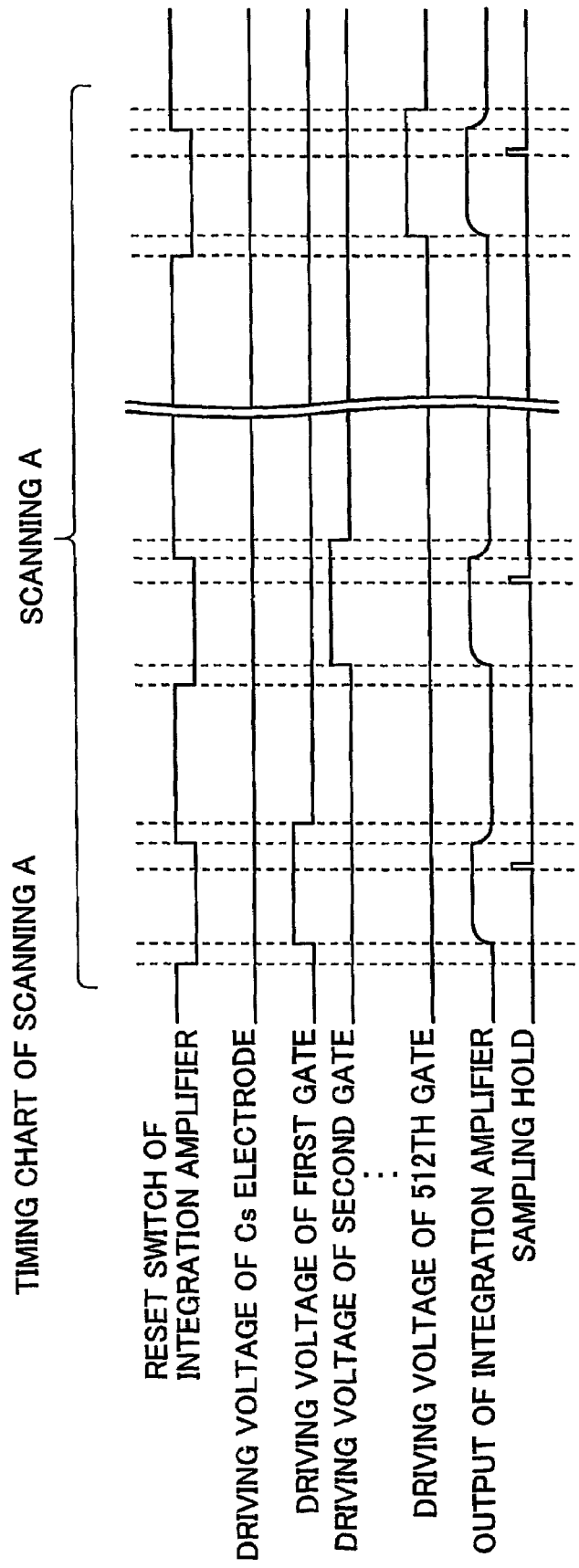
FIG. 12 is a timing chart of scanning A performed in the sequence shown in FIG. 11.

The scanning A is scanning performed mainly with respect to "data detection" of the steps S3 and S4, and corresponds to a period in which the TFT is driven as shown in the timing chart shown in FIG. 12.

Figure 14:
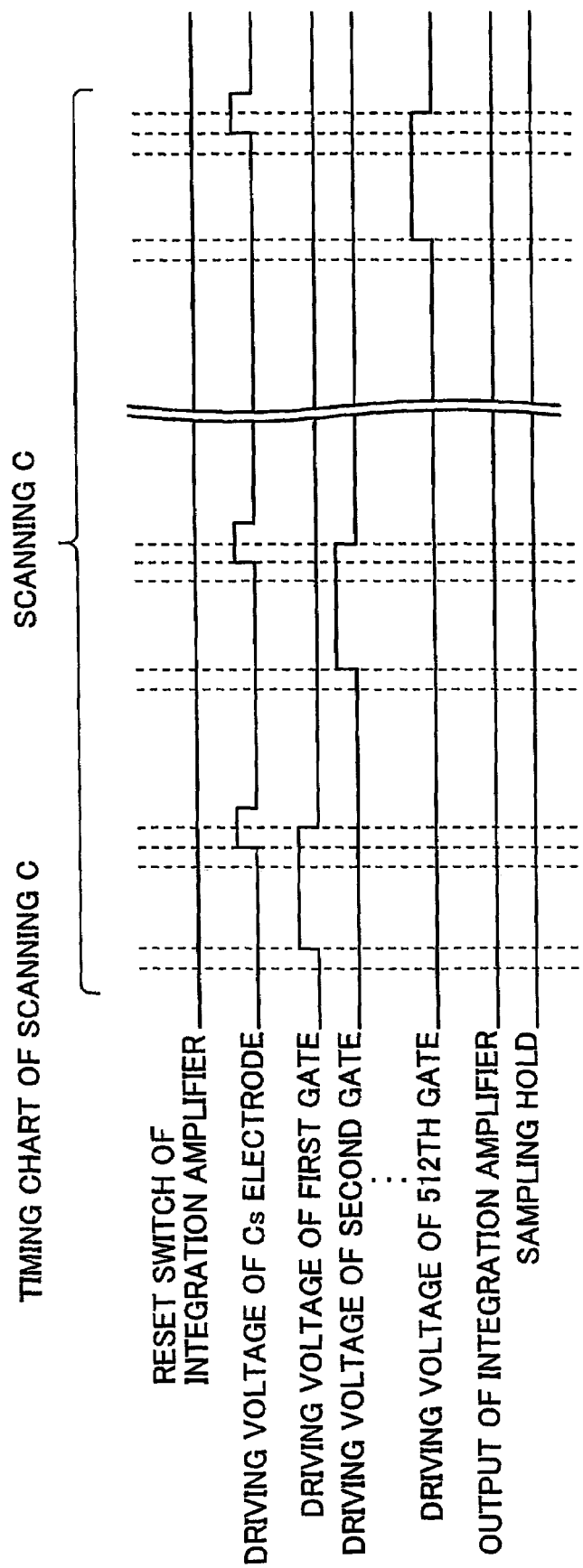
FIG. 14 is a timing chart of scanning C performed in the sequence shown in FIG. 11.

The scanning C is scanning performed mainly with respect to "precharging Cs" of the step S1, and corresponds to a period in which the TFT is driven as shown in the timing chart shown in FIG. 14.

Figure 13:
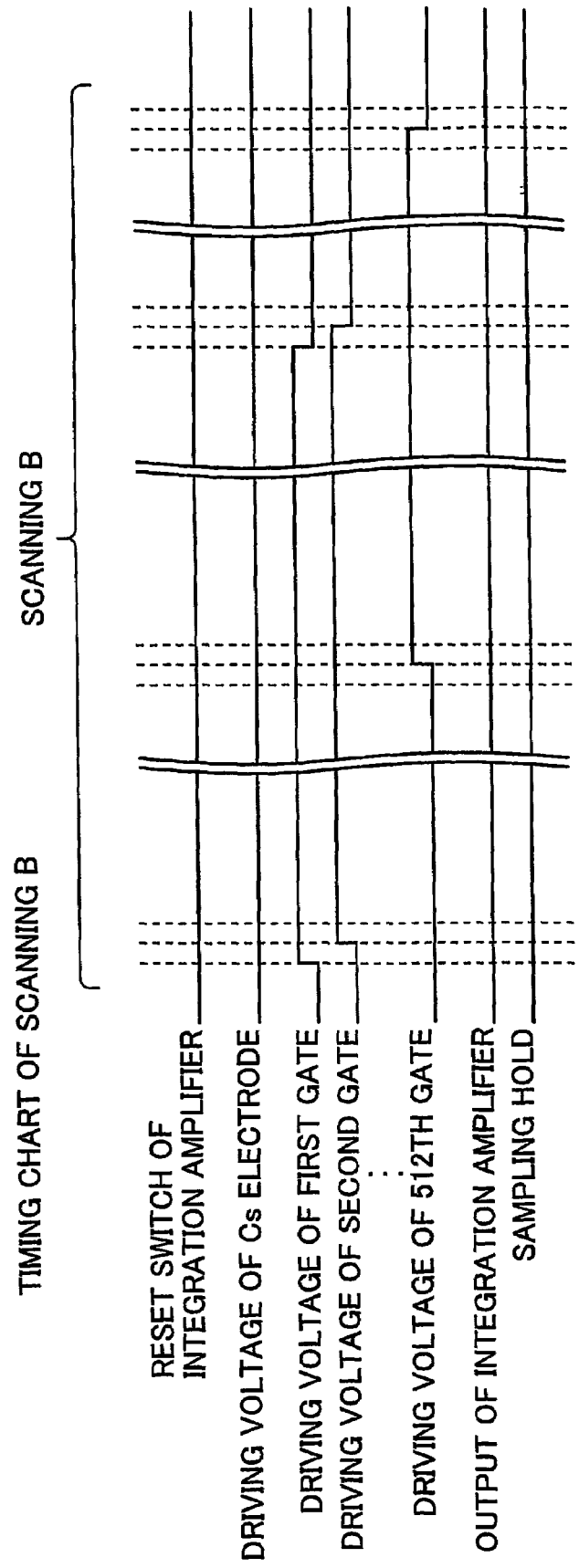
FIG. 13 is a timing chart of scanning B performed in the sequence shown in FIG. 11.

While, the scanning B is scanning performed with respect to the compensation signal that has been added to apply a compensation bias to the gate electrode of the TFT, and corresponds to a period in which the TFT is driven as shown in the timing chart shown in FIG. 13. That is, in the scanning B, a compensation pulse (compensation signal) is applied to the gate electrode of the TFT for a predetermined period so as to intentionally apply a positive bias.

Here, the compensation pulse is applied to the gate electrode, at timings slightly different in respective gate lines (rows), on the basis of a driving frequency of the gate driver (for example, 3 MHz), and the application is performed so that ON periods overlap each other in the respective scanning lines. Thus, even if the compensation pulse period (compensation signal period) is long, it is possible to minimize a time taken to finish applying the compensation pulse to all the data lines, so that this technique is useful.

Of course, it is needless to say that: it is more preferable to apply the compensation pulse to all the scanning lines at once by adopting a gate driver which can drive all the gate lines at once.

According to the compensation driving method, it is possible to adjust a relationship between the ON period Ton and the OFF period Toff in the TFT. Actually, on the basis of the aforementioned experiment result, a relationship in terms of an average time is set so that Ton/Toff=3/100 to 3/10, preferably 1/10. As a result, it is possible to largely reduce the short-time variation of the resistance value of the photodetecting TFT that has been a problem.

Note that, in the steps S3 and S4, it is preferable that a potential of the compensation signal corresponds to an ON potential of the gate in case where the TFT functions as a switching element for address. Thus, it is possible to obtain such an advantage that an output voltage of the gate driver can be shared.

In FIG. 11, the scanning B is performed in each reading cycle. However, as long as Ton/Toff=3/100 to 3/10 in a relationship in terms of an average time, that is, in a time taken to perform all the operations of the image reading, the scanning B may be performed in a plurality of reading cycles.

Further, the compensation pulse means not only a rectangular waveform signal, but also a signal of a curved waveform or a signal having not only a single waveform but also plural waveforms in combination.

Figure 15:
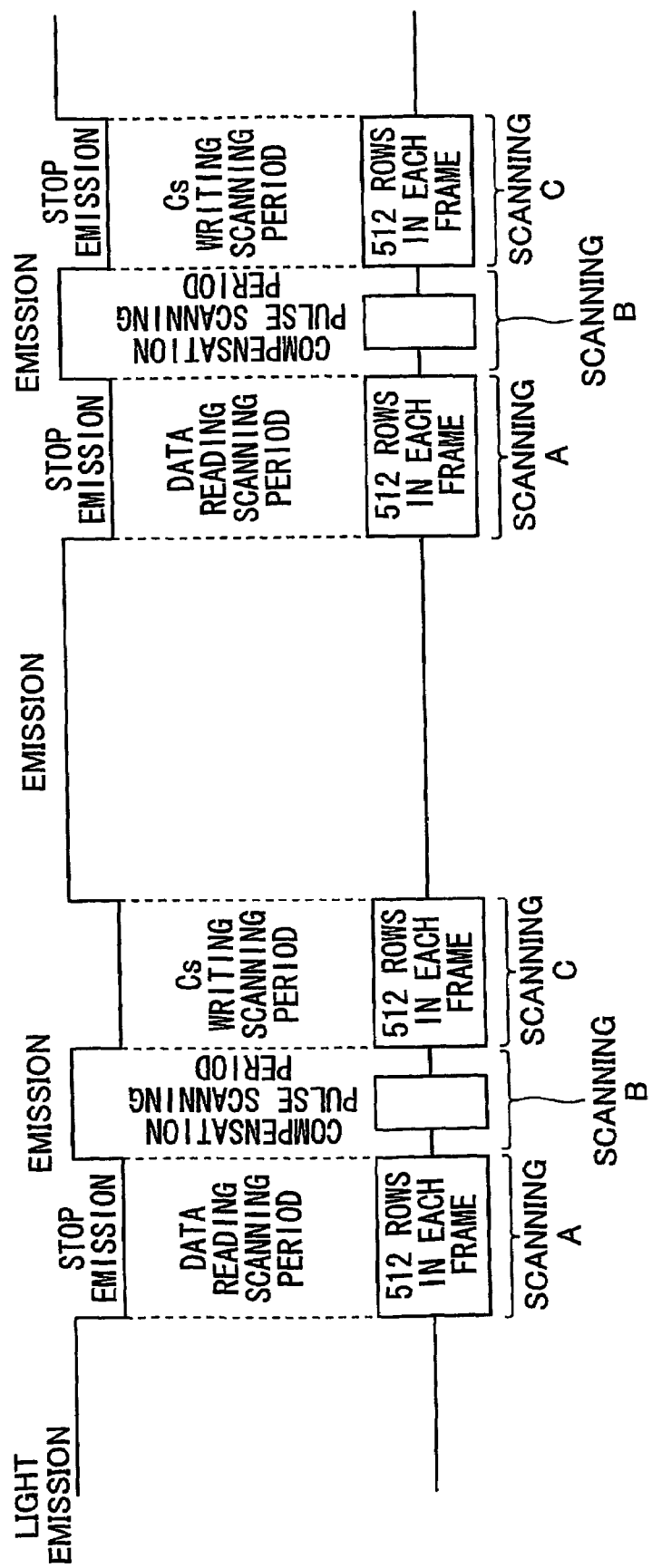
FIG. 15 shows sequence of another compensation driving performed in the reading operation of the image reading device shown in FIG. 1.

Further, as shown in FIG. 15, light emission may be performed during a period of the scanning B (that is, a period in which the compensation signal is applied to the gate electrode). In this case, it is possible to shorten a time taken to turn ON the gate electrode.

Figure 16:
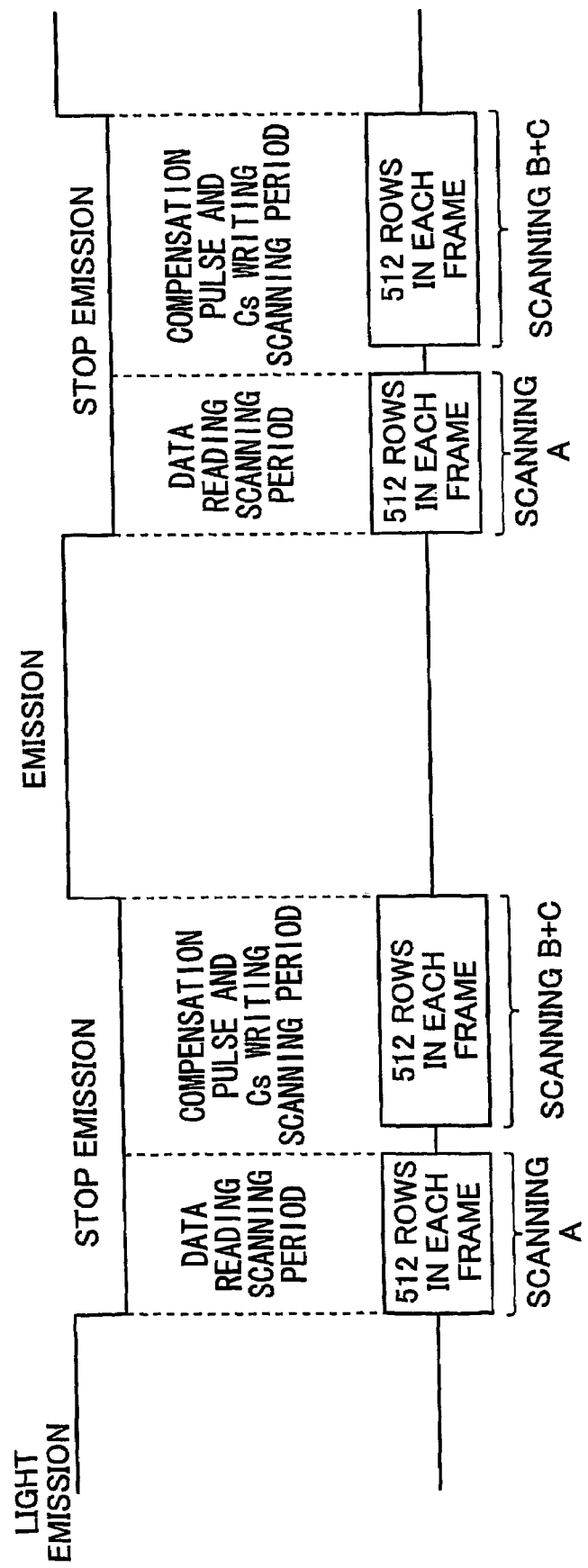
FIG. 16 shows sequence of still another compensation driving performed in the reading operation of the image reading device shown in FIG. 1.
Figure 17:
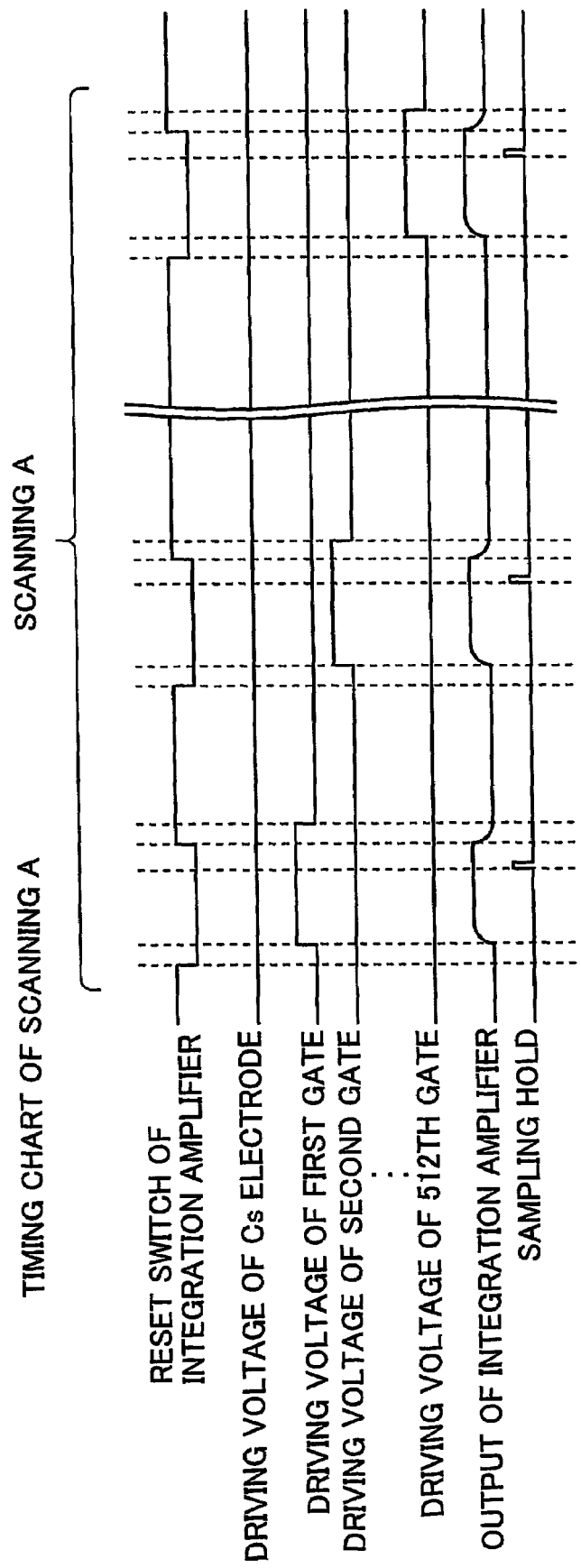
FIG. 17 is a timing chart of scanning A performed in the sequence shown in FIG. 16.
Figure 18:
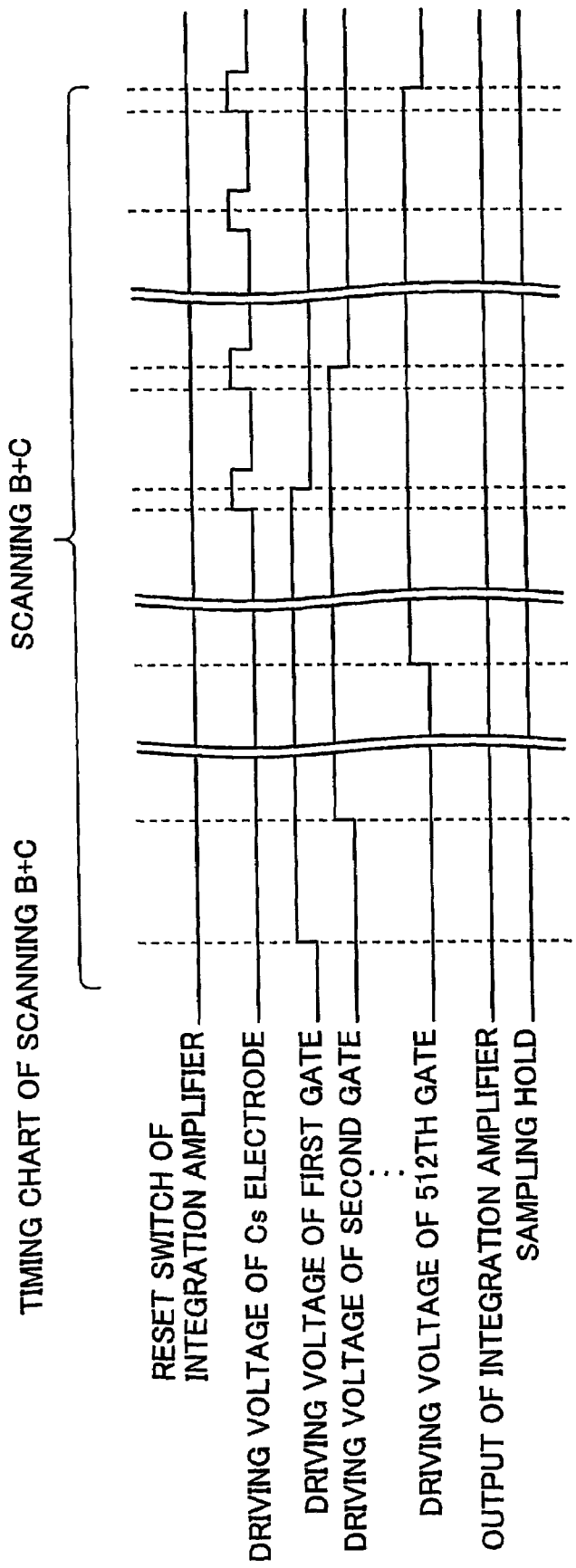
FIG. 18 is a timing chart of scanning A+B performed in the sequence shown in FIG. 16.

Further, FIG. 16 shows a state in which an effect of the scanning C is combined with that of the scanning B, and the scanning B+C enables "providing the compensation signal" and "precharging Cs" to be performed in single scanning. In this case, the scanning A shows a period in which the TFT is driven as shown in the timing chart shown in FIG. 17, and the scanning B+C shows a period in which the TFT is driven as shown in the timing chart shown in FIG. 18. In this manner, by reducing the number of times scanning is performed, it is possible to reduce the power consumption required in driving the two-dimensional image sensor which functions as the image reading device.

Figure 19:
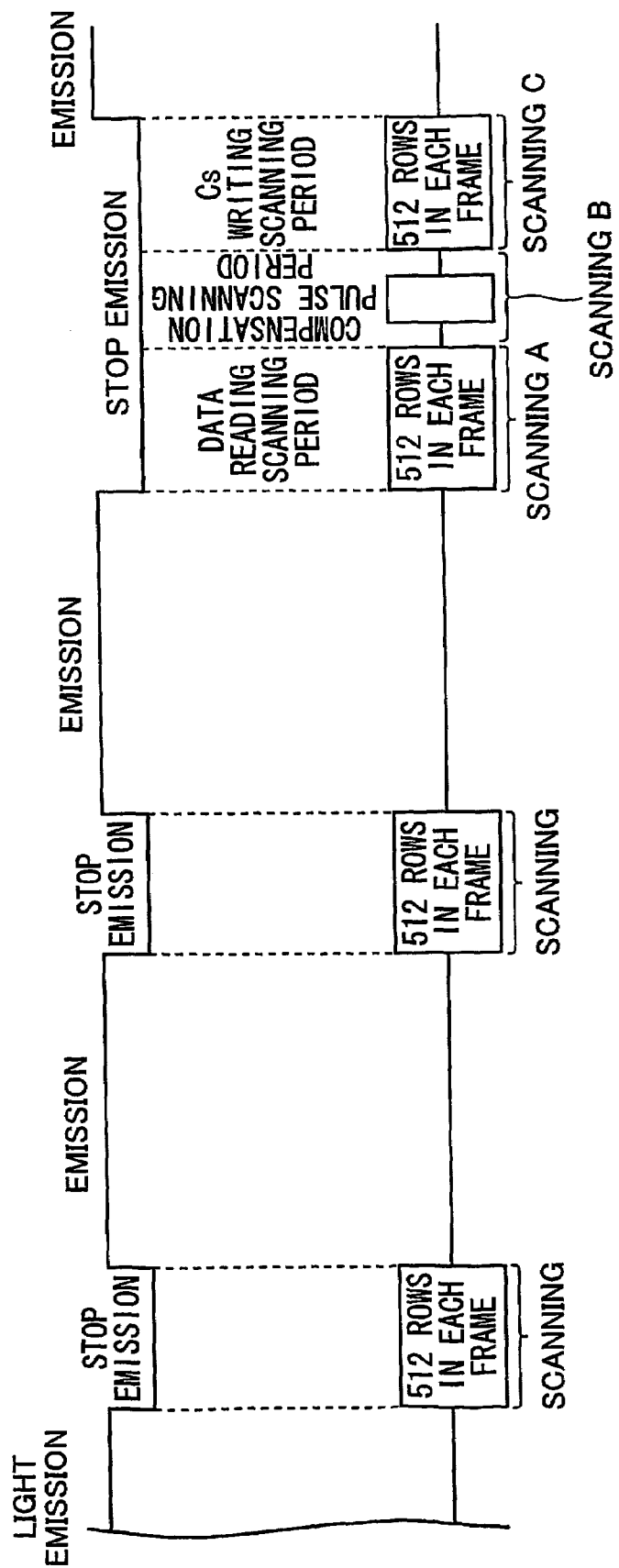
FIG. 19 shows sequence of further another compensation driving performed in the reading operation of the image reading device shown in FIG. 1.

FIG. 19 shows a modification example of FIG. 11, and the scanning of the compensation signal is added so that single scanning is performed in a plurality of reading cycles. In order to make it easy to understand the arrangement, FIG. 19 shows an example of the case where the scanning of the compensation signal is added so that single scanning is performed in 3 cycles, but actually the scanning of the compensation signal may be added so that single scanning is performed in several dozens to several hundreds cycles. Thus, in an ordinary cycle period in which the compensation signal is not applied, a period in which the compensation signal is added does not prevent the reading operation performed in real time. That is, during a period from the compensation signal scanning to the next compensation signal scanning, it is possible to see the read images in a sequential manner.

However, it is necessary to set the time, in which the compensation signal is added, to be long so that Ton/Toff=3/100 to 3/10 in average. Thus, this is such reading mode that: after reading images for one minute in real time, there occurs a blank period in which the compensation signal is added for several seconds.

Figure 20:
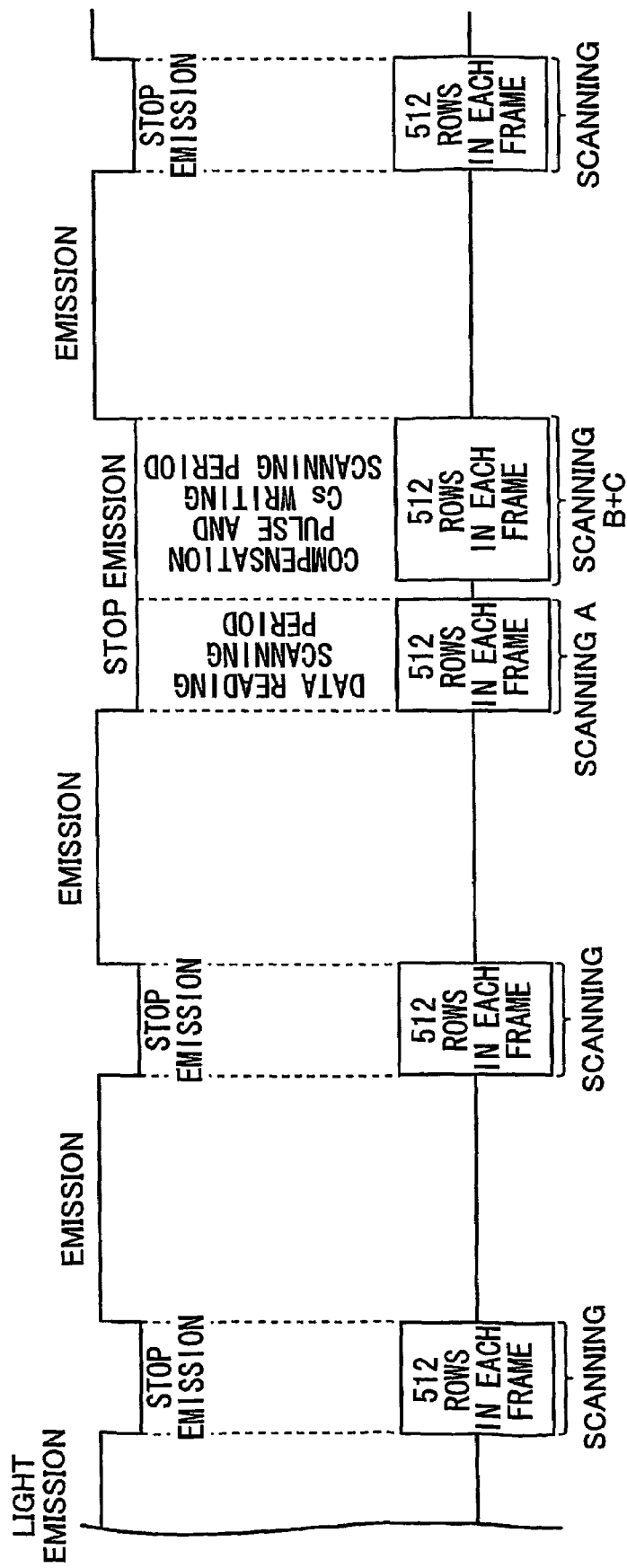
FIG. 20 shows sequence of yet another compensation driving performed in the reading operation of the image reading device shown in FIG. 1.

Likewise, it is possible to apply a process, in which single scanning of the compensation signal is added in plural reading cycles, to the sequence shown in FIG. 16, as shown in FIG. 20.

However, in adopting the process in which single scanning of the compensation signal is added in plural reading cycles, there is a case where the timing at which the compensation signal is added (cycle) deviates from a most appropriate range of the frame frequency shown in the aforementioned preliminary experiment (FIG. 13). In this case, it is preferable to adjust a voltage value (amplitude) of the added compensation signal so that the voltage value is most appropriate.

Note that, in the aforementioned embodiment, the description is given on the compensation driving method of the image reading device in which a single TFT element functions as both the photodetecting TFT and the switching TFT, but it is possible to apply the compensation driving method to an image reading device in which the photodetecting TFT and the switching TFT are separately provided. Also in this case, a signal applied to the gate electrode of the photodetecting TFT is adjusted (that is, the compensation pulse is introduced), and a condition under which the compensation pulse is applied is set as required so that Ton/Toff=3/100 to 3/10. Thus, it is possible to obtain the effect of the present invention.

The following Embodiment 2 will explain an example of the image reading device in which the photodetecting TFT and the switching TFT are separately provided.

Embodiment 2

Another embodiment of the present invention is described as follows. Note that, as in Embodiment 1, also the present embodiment will explain an example of the two-dimensional image sensor which functions as an image reading device.

Figure 21:
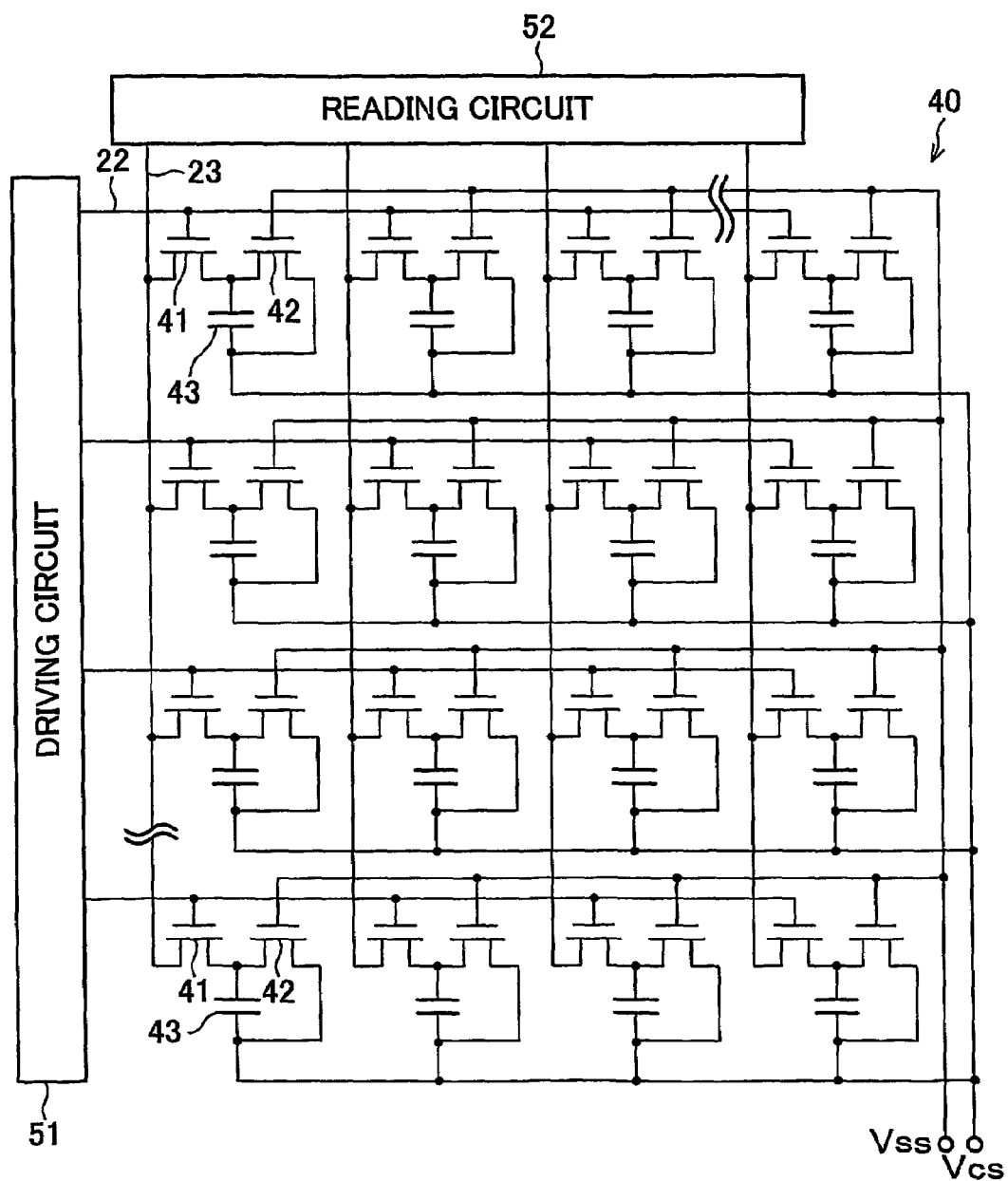
FIG. 21 is a block diagram schematically showing a sensor substrate of a two-dimensional image sensor provided with an image reading device according to another embodiment of the present invention.

The two-dimensional image sensor according to the present embodiment includes a sensor substrate 40 shown in FIG. 21.

As shown in FIG. 21, the sensor substrate 40 includes (i) gate lines 22 each of which is extended from a driving circuit 51 as an electric wiring and (ii) data lines 23 each of which is extended from a reading circuit 52 as an electric wiring, and the gate lines 22 and the data lines 23 are disposed in an X-Y matrix manner (lattice manner), and each lattice sections each pixel. Each pixel includes: a thin film transistor (referred to as switching TFT) 41; a thin film transistor for light detection which functions as a phototransistor (referred to as photodetecting TFT) 42; and a pixel capacitor 43 which functions as an electric charge storage capacitor.

The following description explains a principle of basic operations of the sensor substrate 40.

The photodetecting TFT 42 of each pixel is set to be in an OFF state while applying a predetermined bias (Vss) so that a dark current I dark is kept low. Under this condition, when light emitted from the outside is incident on the photodetecting TFT, photo-excited carrier is generated in a channel section, so that a resistance value of the photodetecting TFT 42 drops. The resistance value variation of the photodetecting TFT occurs as a difference in a current (bright current I photo) flowing between a source and a drain of the photodetecting TFT 42, i.e., a difference in an amount of electric charge flowing in each photodetecting TFT 42. As a result, a difference occurs in a charging amount (or discharging amount) of the pixel capacitor 43 connected to each photodetecting TFT 42.

Then, the switching TFT 41 provided on each pixel is driven so as to be in an ON state in a line-sequential manner, so that it is possible to read, via the data line 23, the amount of electric charge stored in each pixel capacitor 43, so that it is possible to obtain plain distribution information of an image on the basis of light which is incident on the sensor substrate 40.

The plane distribution information of the image is detected by means of the detection IC 25 constituting the reading circuit 52.

Figure 22:
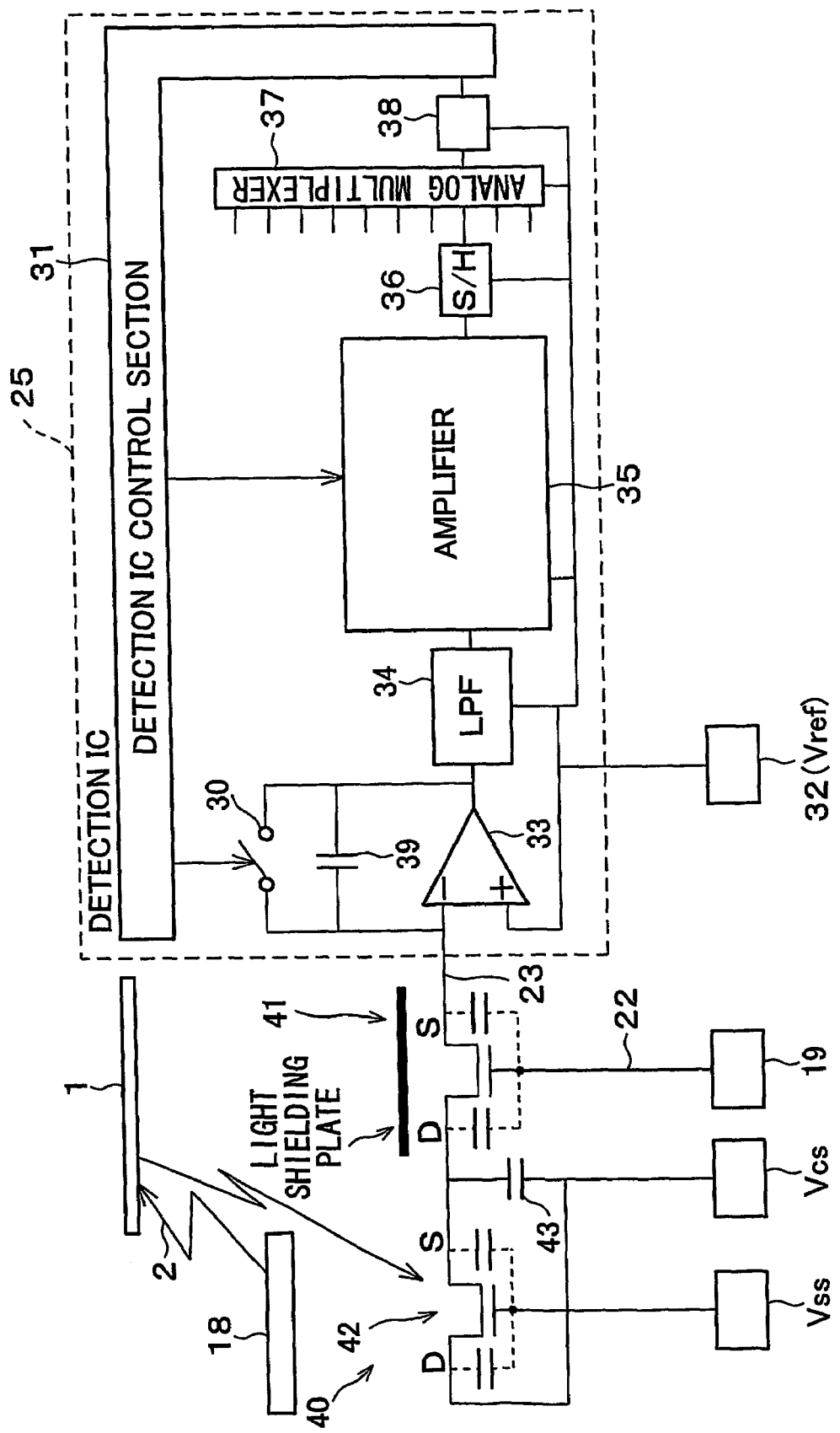
FIG. 22 is a block diagram schematically showing an arrangement of the image reading device provided on the two-dimensional image sensor.

As shown in FIG. 22, each of the detection ICs 25, which are prepared corresponding to the number of detected lines (several hundreds lines for example), internally includes an integration amplifier 33, a low pass filter 34, an amplifier 35, a sample hold circuit 36, and the like, and there are provided an analog multiplexer 37 and an A/D (analog/digital) converting circuit 38 at the following stage of the sample hold circuit 36.

Further, in the detection IC 25, dual mutual sampling is performed so as to remove offsetting and noise of each circuit.

In the detection IC 25 arranged in this manner, electric charge of the auxiliary capacitor 17 that has been inputted via the data line 23 to the detection IC 25 is, first, inputted to the integration amplifier 33 as negative input, so that the integration amplifier 33 outputs a potential in proportion to the inputted electric charge. Further, a reference voltage (Vref) 32 is inputted to the integration amplifier 33 as positive input.

Output of the integration amplifier 33 is inputted to the amplifier 35 via the low pass filter 34 provided to reduce the noise, and is amplified by a predetermined scale factor, and is then outputted.

Further, the output of the amplifier 35 inputted to the sampling hold circuit 36, and is temporarily stored there, and a value of the stored output is outputted to one of a plurality of inputs of the analog multiplexer 37.

The output of the analog multiplexer 37 is inputted to the A/D converting circuit 38 positioned at the next stage, and the output is converted from analog data to digital data in the A/D converting circuit 38, and the converted data is outputted to the control/communication substrate 24 as image data.

Further, the integration amplifier 33 has a reset switch 30, and the reset switch 30 is controlled by output of the control section 31 of the detection IC 25. The control section 31 controls the detection IC 25 and functions as an interface of the detection print substrate 26.

Here, the photodetecting TFT 42 arranged in the foregoing manner is driven as in the photodetecting TFT 7 of Embodiment 1.

That is, in the photodetecting TFT 42, emission light 2 emitted from the back light unit 18 is reflected by the document 1, and is irradiated to a semiconductor layer (not shown)

having photosensitivity. Here, the photodetecting TFT 42 is arranged so that: since a property of the resistance value of the photodetecting TFT 42 varies, a voltage which has polarity causing an OFF state is applied in an ordinary state so that a voltage having opposite polarity (compensation signal) is applied for a predetermined period once in each frame. This is detailed as follows.

Figure 23:
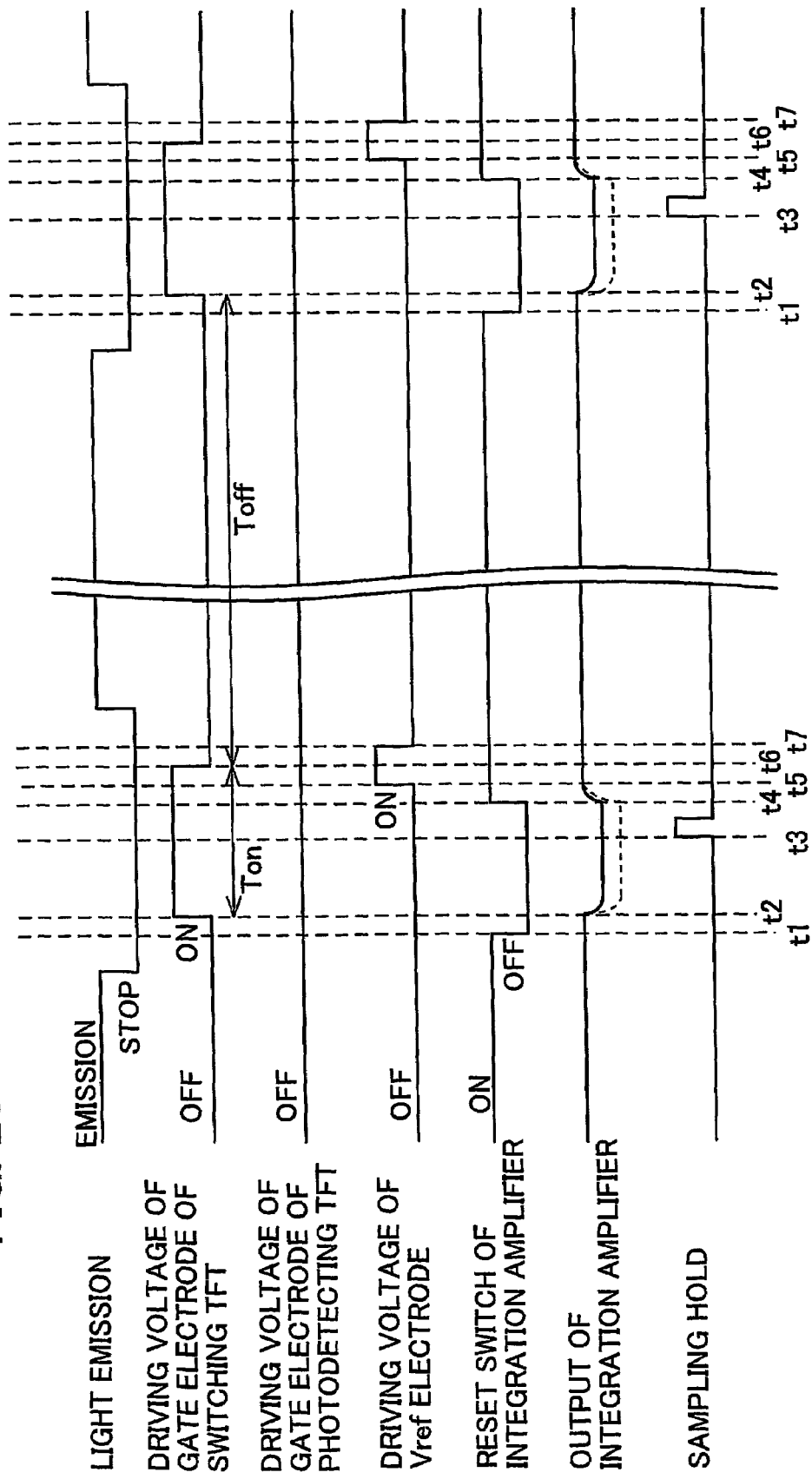
FIG. 23 is a timing chart of a reading operation of the image reading device shown in FIG. 22.

The following description explains operations of the two-dimensional image sensor arranged in the foregoing manner with reference to FIGS. 23 to 27. FIG. 23 is a timing chart showing a case where the compensation signal is not applied in the two-dimensional image sensor of two-transistor type (in which the switching TFT and the photodetecting TFT are separately provided on each pixel). FIG. 23 shows a case where a DC bias is applied to Vss so as to be always in an OFF state.

In case of driving the TFT as shown in the timing chart, there arises such a problem that the resistance value of the photodetecting TFT varies in a short time, so that the reading accuracy is deteriorated.

Figure 24:
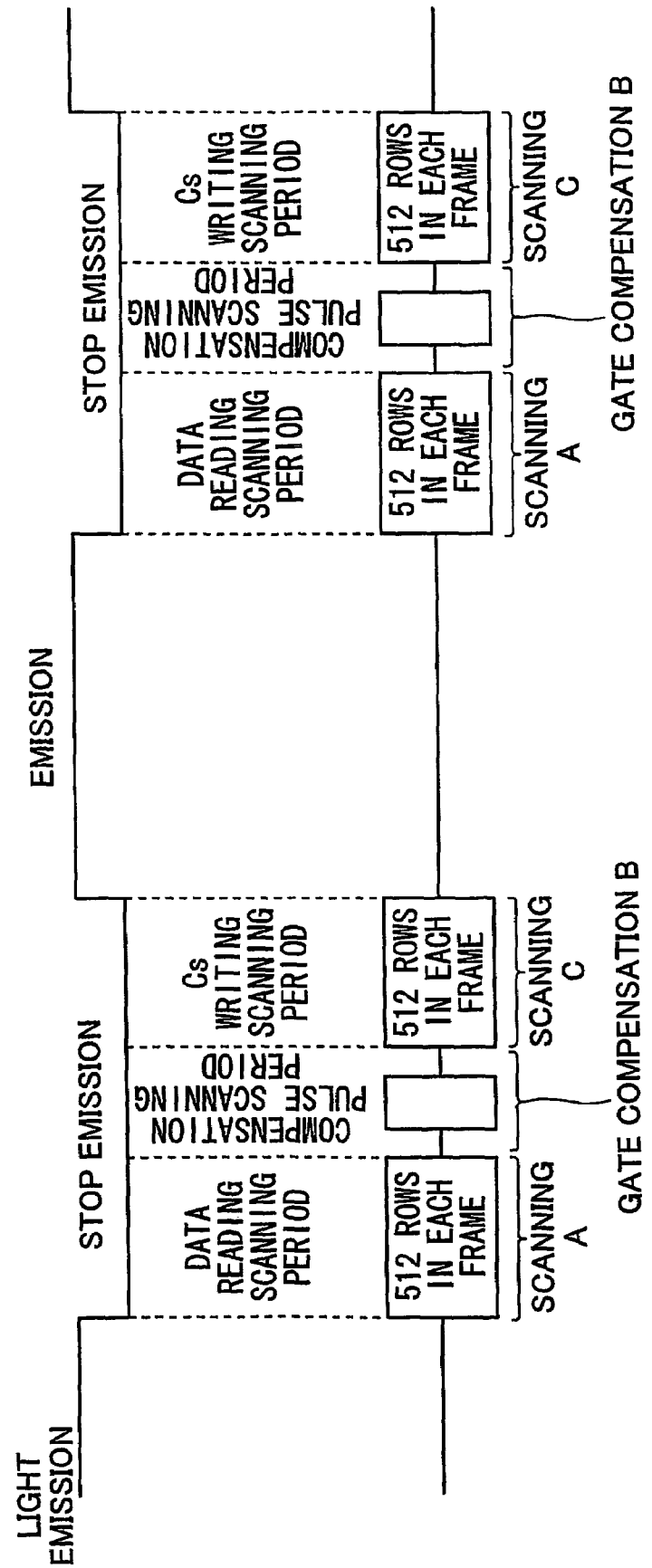
FIG. 24 shows sequence of compensation driving performed in the reading operation of the image reading device shown in FIG. 22.

Then, the two-dimensional image sensor may be driven by sequence shown in FIG. 24. That is, in order to suppress the foregoing property of the TFT, sequence for applying a compensation signal may be adopted.

In FIG. 24, a basic idea is the same as in the case of the one-transistor-type two-dimensional image scanner shown in FIG. 11, and a scanning period is divided into "scanning A" and "scanning C", and "scanning B" which is a period for applying a compensation bias to the gate electrode of the photodetecting TFT is provided between the scanning A and the scanning C.

Figure 25:
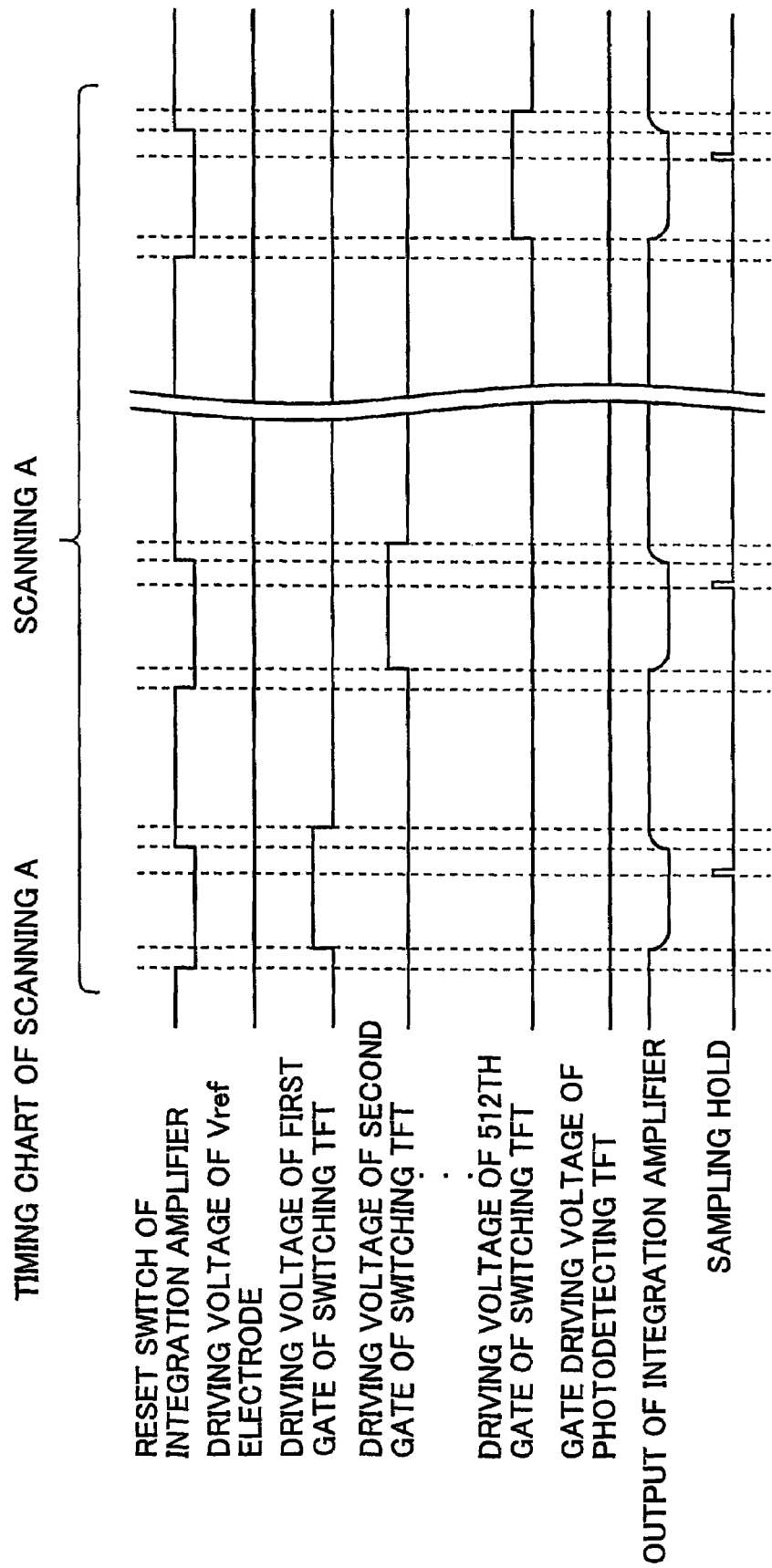
FIG. 25 is a timing chart of scanning A performed in the sequence shown in FIG. 24.
Figure 26:
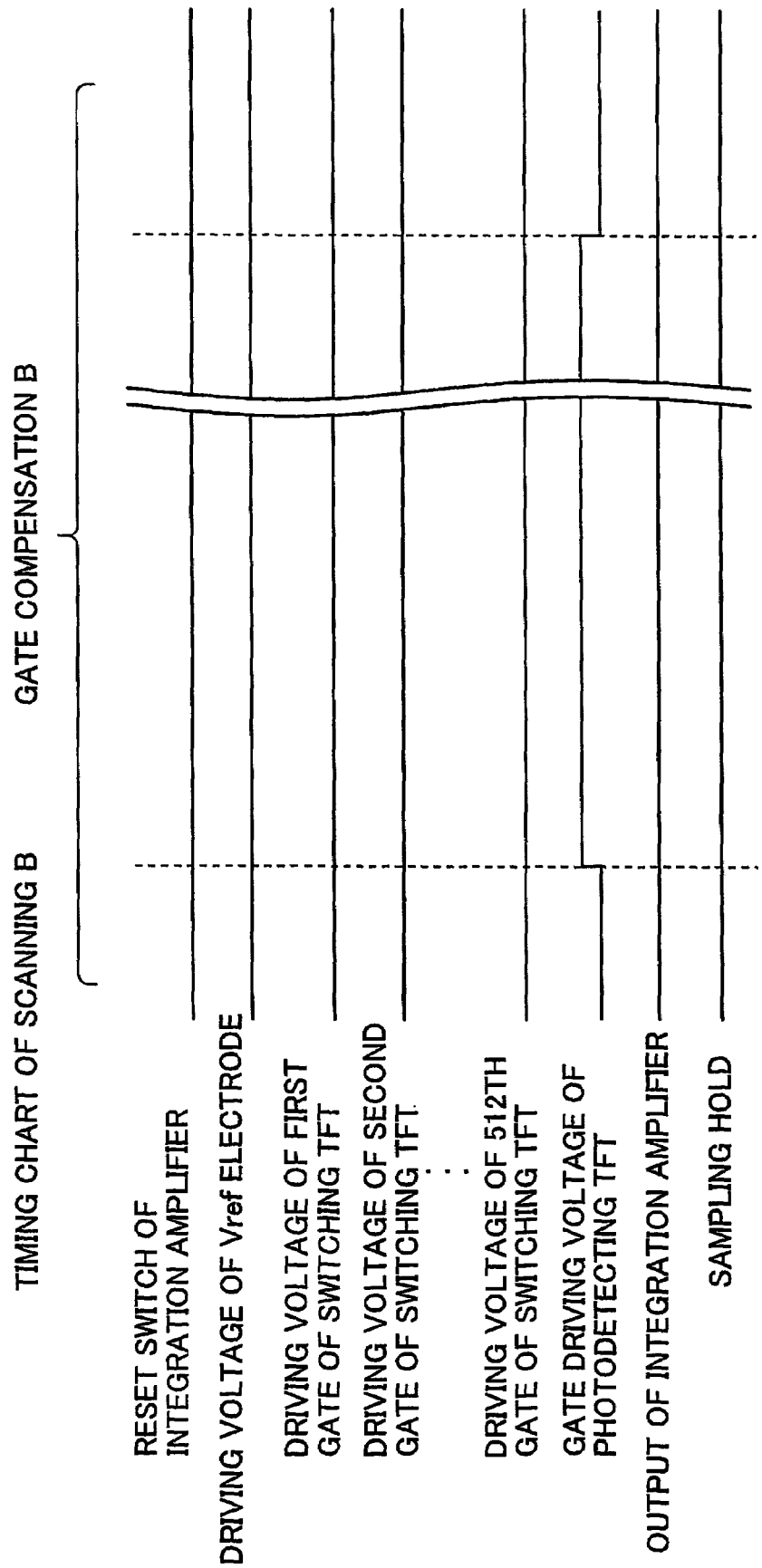
FIG. 26 is a timing chart of scanning B performed in the sequence shown in FIG. 24.

The scanning A is scanning performed with respect to "data detection", and is a period in which the TFT is driven as shown in the timing chart shown in FIG. 25.

Figure 27:
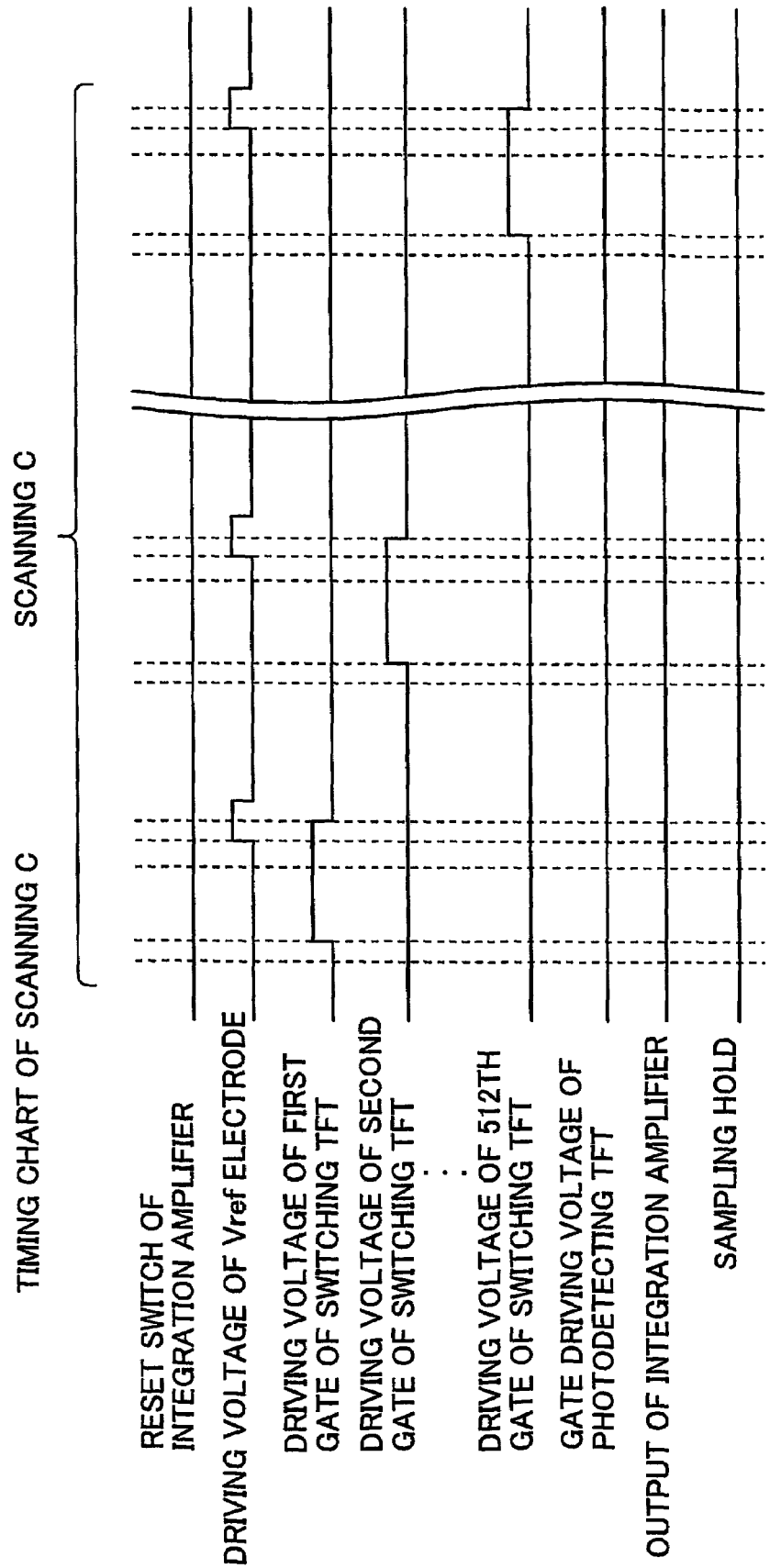
FIG. 27 is a timing chart of scanning C performed in the sequence shown in FIG. 24.

The scanning C is scanning performed with respect to "precharging Cs", and is a period in which the TFT is driven as shown in the timing chart shown in FIG. 27.

While, the scan B is scanning performed with respect to the compensation signal that has been added to apply a compensation bias to the gate electrode of the TFT, and corresponds to a period in which the TFT is driven as shown in the timing chart shown in FIG. 27. That is, in the scanning B, a compensation pulse (compensation signal) is applied to the gate electrode of the TFT for a predetermined period so as to intentionally apply a positive bias.

However, in this case, as apparent from FIG. 21, all the gate electrodes of the photodetecting TFT are short-circuited, so that the compensation signals are simultaneously inputted to the gates of the photodetecting TFTs of all the pixels. Thus, it is not necessary to perform scanning. Also in this case, a signal applied to the gate electrode of the photodetecting TFT is adjusted (that is, the compensation pulse is introduced), and a condition under which the compensation pulse is applied is set as required so that Ton/Toff=3/100 to 3/10. Thus, it is possible to obtain the effect of the present invention.

As described above, in both the cases of (i) the one-transistor-type two-dimensional image sensor described in Embodiment 1 and (ii) the two-transistor-type two-dimensional image sensor described in Embodiment 2, by applying the compensation signal, it is possible to suppress the short-time variation of the resistance value of the photodetecting TFT, so that it is possible to improve the operability and the reliability of the two-dimensional image sensor which functions as an image reading device using the photodetecting TFT. Further, the arrangement is effective since the compensation signal can be added in such a period that the image reading is not influenced.

Further, the present invention is effective also in a photodetecting TFT of an input-output-combination-type display, provided with (i) a display function and (ii) a photodetecting function, which is disclosed in the aforementioned Patent Document 5: Japanese Unexamined Patent Publication No. 151669/2002 (Tokukai 2002-151669)(Publication date: May 24, 2002)(Corresponding U.S. Application No. US2002/0093581).

As described above, the image reading device of the present invention, which uses a thin film transistor having a photo response property as a photodetecting element, includes driving means for applying a voltage to a gate electrode of the thin film transistor so as to drive the thin film transistor into an ON state or an OFF state, wherein the driving circuit applies a voltage, whose polarity is opposite to average polarity of a voltage making the thin film transistor in the OFF state, to the gate electrode in an arbitrary period.

Therefore, by applying a voltage, whose polarity is opposite to average polarity of the voltage making the thin film transistor in the OFF state, to the gate electrode in the arbitrary period, it is possible to prevent disadvantage which occurs in case of keeping on applying the voltage, making the thin film transistor in the OFF state, to the gate electrode, that is, it is possible to suppress the short-time variation of a resistance value of the thin film transistor.

In this manner, by suppressing the short-time variation of the resistance value of the thin film transistor used as a photodetecting element, it is possible to appropriately correct (i) sensitivity of the thin film transistor and (ii) correction data that has been obtained in a calibration operation performed to obtain the correction data with respect to a gray scale property.

As the correction data at this time, it is possible to use first calibration data that has been obtained in a calibration operation performed right after turning ON a power source of the device, so that it is not necessary to frequently perform the calibration operation unlike conventional techniques.

Further, influences of the short-time variation of the resistance value of the thin film transistor are not accumulated, so that there is no possibility that the variation is so large that it is difficult to restore the variation. Thus, it is possible to obtain the reliability kept for an extended period of time.

Therefore, it is possible to perform image reading stably for an extended period of time. As a result, it is possible to obtain such advantage that the operability and the reliability of the image reading device are improved.

It is preferable that the arbitrary period is a period in which the image reading is not performed so as not to influence the image reading.

Generally, when the thin film transistor is used as a photodetecting element, it is necessary to suppress the short-time variation of the resistance value of the thin film transistor so as not to exceed 10% in consideration for the light detection accuracy.

Then, in order to suppress the short-time variation of the resistance value of the thin film transistor so as not to exceed 10%, the following procedure is performed.

A time for applying a voltage in the arbitrary period is set so that a rate indicating relative variation of a bright current of the thin film transistor is within a range from 0.9 to 1.1.

Further, the arbitrary period is set to be a period whose length is 3% to 30% with respect to an entire period in which the thin film transistor is driven.

Further, when images are sequentially read at an arbitrary cycle, the cycle is set to 0.1 Hz to 10 Hz.

Further, the photodetecting element may function as a pixel selection element for selecting a pixel.

In this case, it is possible to realize an image reading device, having a simple structure, which realizes highly-fine image reading, and it is also possible to improve the operability and the reliability of the device.

Further, a potential of a voltage applied to the gate electrode in the arbitrary period may be set to be equal to a potential of a voltage in the case where the thin film transistor is in the ON state.

In this case, a potential of the voltage applied to the gate electrode in the arbitrary period may be set to be equal to a potential of a voltage making the thin film transistor in the ON state, so that the voltage applied to the gate electrode can be used as both (i) the voltage making the thin film transistor in the ON state and (ii) a voltage which functions as the compensation signal.

Thus, it is not necessary to switch the voltage in a complicate manner, so that it is possible to simplify the structure of the driver for driving the gate electrode. As a result, it is possible to miniaturize the device and to reduce the power consumption.

An image reading method, in which a document image is read by detecting a photoelectric transfer amount of a photoelectric transfer element which has (i) a thin film transistor having a photo response property and (ii) a storage capacitor connected to the thin film transistor, includes: a first step of charging the storage capacitor with a predetermined amount of electric charge; a second step of discharging the electric charge from the storage capacitor, by emitting light to the thin film transistor while the thin film transistor is being in an OFF state, after charging the storage capacitor with the electric charges; a third step of detecting the photoelectric transfer amount of the photoelectric transfer element by obtaining an amount of remaining electric charge in the storage capacitor after discharging the electric charge; and a fourth step, when the three steps are regarded as one cycle of image reading, of applying a voltage, whose polarity is opposite to average polarity of a voltage making the thin film transistor in the OFF state, to a gate electrode of the thin film transistor within a period in which the third step shifts to the first step of a next cycle.

Therefore, by applying a voltage, whose polarity is opposite to average polarity of the voltage making the thin film transistor in the OFF state, to the gate electrode in the arbitrary period, it is possible to prevent disadvantage which occurs in case of keeping on applying the voltage, making the thin film transistor in the OFF state, to the gate electrode, that is, it is possible to suppress the short-time variation of a resistance value of the thin film transistor.

In this manner, by suppressing the short-time variation of the resistance value of the thin film transistor used as a photodetecting element, it is possible to appropriately correct (i) sensitivity of the thin film transistor and (ii) correction data that has been obtained in a calibration operation performed to obtain the correction data with respect to a gray scale property.

As the correction data at this time, it is possible to use first calibration data that has been obtained in a calibration operation performed right after turning ON a power source of the device, so that it is not necessary to frequently perform the calibration operation unlike conventional techniques.

Further, influences of the short-time variation of the resistance value of the thin film transistor are not accumulated, so that there is no possibility that the variation is so large that it is difficult to restore the variation. Thus, it is possible to obtain the reliability kept for an extended period of time.

Therefore, it is possible to perform image reading stably for an extended period of time. As a result, it is possible to obtain such advantage that the operability and the reliability of the image reading device are improved.

Moreover, within a period constituted of the first step to the third step for image reading, i.e., within a period in which the third step shifts to the first step of the next cycle, the voltage having the opposite polarity is applied, so that the application of the voltage does not influence the image reading.

Thus, even in the case where images are sequentially read, the application of the voltage does not influence the image reading, so that it is possible to perform the image reading stably. As a result, it is possible to improve the operability and the reliability of the image reading device.

The fourth step may be carried out once in a plurality of cycles.

In this case, it is possible to shorten a period from the third step (excluding the fourth step) to the first step of the next cycle, so that when images are sequentially read, it is possible to give continuity to the read images until the fourth step is carried out. Thus, it is possible to display the read images with continuity.

As described above, when the thin film transistor is used as a photodetecting element, it is necessary to suppress the short-time variation of the resistance value of the thin film transistor so as not to exceed 10% in consideration for the photodetection accuracy.

Then, in order to suppress the short-time variation of the resistance value of the thin film transistor so as not to exceed 10%, the following procedure is performed.

A time in which the voltage is applied to the gate electrode in the fourth step is set so that a rate indicating relative variation of a bright current of the thin film transistor is within a range of from 0.9 to 1.1.

Further, the fourth step is carried out in a period whose length is 3% to 30% with respect to an entire period in which the thin film transistor is driven.

Further, the cycle is set to 0.1 Hz to 10 Hz.

Further, the thin film transistor may function as both a pixel selection element and the photodetecting element.

In this case, it is possible to realize an image reading device, having a simple structure, which realizes highly-fine image reading, and it is also possible to improve the operability and the reliability of the device.

Further, a potential of the voltage applied to the gate electrode in the arbitrary period may be set to be equal to a potential of a voltage making the thin film transistor in the ON state.

In this case, a potential of the voltage applied to the gate electrode in the arbitrary period may be set to be equal to a potential of a voltage making the thin film transistor in the ON state, so that the voltage applied to the gate electrode can be used as both (i) the voltage making the thin film transistor in the ON state and (ii) a voltage which functions as the compensation signal.

Thus, it is not necessary to switch the voltage in a complicate manner, so that it is possible to simplify the structure of the driver for driving the gate electrode. As a result, it is possible to miniaturize the device and to reduce the power consumption.

Further, application of the voltage to the gate electrode that should be performed in the fourth step may be performed not in the fourth step but in a period in which the storage capacitor is charged with a predetermined amount of electric charge in the first step of the next cycle.

In this case, it is not necessary to provide a period for carrying out the fourth step, so that it is possible to shorten a period from the third step to the first step of the next cycle.

Thus, when images are sequentially read, it is possible to improve the reading speed, and it is also possible to improve the operability of the device.

The invention being thus described, it will be obvious that the same way may be varied in many ways. Such variations are not to be regarded as a departure from the spirit and scope of the invention, and all such modifications as would be obvious to one skilled in the art are intended to be included within the scope of the following claims.

INDUSTRIAL APPLICABILITY

The image reading device of the present invention can be preferably applied to a device, required to be smaller or to be miniaturized, which uses a TFT as a photodetecting element, for example, the image reading device can be preferably applied to a contact-type flat bed scanner, PDA (Personal Digital Assistants), and the like, each of which reads a document and a photograph.

The invention claimed is:

1. An image reading device, in which thin film transistors having a photo response property are used as photodetecting elements and the thin film transistors are disposed in a matrix manner so as to read a document image in a single frame period, comprising:
driving means for applying a voltage to a gate electrode of each of the thin film transistors so as to drive the thin film transistor into an ON state or an OFF state, wherein
the driving means applies a voltage, whose polarity is opposite to average polarity of a voltage making the thin film transistor in the OFF state, to the gate electrode in an arbitrary period in a period whose length is 3-30% with respect to the single frame.

2. The image reading device as set forth in claim 1, wherein the arbitrary period is a period in which image reading is not performed.

3. The image reading device as set forth in claim 1, wherein, when images are sequentially read at an arbitrary cycle, the cycle ranges from 0.1 Hz to 10 Hz.

4. The image reading device as set forth in claim 1, wherein the photodetecting element functions as a pixel selection element for selecting a pixel.

5. The image reading device as set forth in claim 1, wherein a potential of the voltage applied to the gate electrode in the arbitrary period is set to be equal to a potential of the voltage making the thin film transistor in the ON state in the period whose length is 3-30% with respect to the single frame.

6. An image reading device, in which thin film transistors each having a photo response property are used as photodetecting elements and the thin film transistors are disposed in a matrix manner so as to read a document image in a single frame period, comprising
a driving circuit for applying a voltage to a gate electrode of each of the thin film transistors so as to drive the thin film transistors into an ON state or an OFF state, wherein
the driving circuit applies a voltage, whose polarity is opposite to average polarity of a voltage making the thin film transistor in the OFF state, to the gate electrode in an arbitrary period in a period whose length is 3-30% with respect to the single frame.

7. A flat bed scanner, provided with an image reading device in which thin film transistors each having a photo response property are used as photodetecting elements and the thin film transistors are disposed in a matrix manner so as to read a document image in a single frame period, the scanner comprising
a driving circuit for applying a voltage to a gate electrode of each of the thin film transistors so as to drive the thin film transistors into an ON state or an OFF state, wherein
the driving circuit applies a voltage, whose polarity is opposite to average polarity of a voltage making the thin film transistor in the OFF state, to the gate electrode in an arbitrary period in a period whose length is 3-30% with respect to the single frame.

8. A handy scanner, provided with an image reading device in which thin film transistors each having a photo response property are used as photodetecting elements and the thin film transistors are disposed in a matrix manner so as to read a document image in a single frame period, comprising
a driving circuit for applying a voltage to a gate electrode of each of the thin film transistors so as to drive the thin film transistors into an ON state or an OFF state, wherein
the driving circuit applies a voltage, whose polarity is opposite to average polarity of a voltage making the thin film transistor in the OFF state, to the gate electrode in an arbitrary period in a period whose length is 3-30% with respect to the single frame.

9. An image reading method, in which a document image is read by detecting a photoelectric transfer amount of a photoelectric transfer element which has (i) thin film transistors each having a photo response property and (ii) a storage capacitor connected to each of the thin film transistors disposed in a matrix manner, the method comprising:
a first step of charging the storage capacitor with a predetermined amount of electric charge;
a second step of discharging the electric charge from the storage capacitor, by emitting light to the thin film transistor while the thin film transistor is being in an OFF state, after charging the storage capacitor with the electric charge; and
a third step of detecting the photoelectric transfer amount of the photoelectric transfer element by obtaining an amount of remaining electric charge in the storage capacitor after discharging the electric charge; and wherein:
when a period for carrying out the three steps is regarded as one cycle of image reading and when a period whose length is equal to a total of said one cycle and a period in which the third step shifts to the first step of a next cycle is regarded as a single frame period, there is carried out a fourth step of applying a voltage whose polarity is opposite to average polarity of a voltage making the thin film transistor in the OFF state, to a gate electrode of the thin film transistor within a period whose length is 3-30% with respect to the single frame.

10. The method as set forth in claim 9, wherein the fourth step is carried out once in a plurality of cycles.

11. The method as set forth in claim 9, wherein the cycle ranges from 0.1 Hz to 10 Hz.

12. The method as set forth in claim 9, wherein a potential of the voltage applied to the gate electrode in the fourth step is set to be equal to a potential of the voltage making the thin film transistor in the ON state.

13. The method as set forth in claim 9, wherein application of the voltage to the gate electrode that should be performed in the fourth step is performed not in the fourth step but in a period in which the storage capacitor is charged with a predetermined amount of the electric charge in the first step of the next cycle.

14. The method as set forth in claim 9, wherein the thin film transistor functions as both a pixel selection element for selecting a pixel and the photodetecting element.

* * * * *